US007684252B2

(12) United States Patent
Wu

(10) Patent No.: US 7,684,252 B2
(45) Date of Patent: Mar. 23, 2010

(54) METHOD AND STRUCTURE FOR OPERATING MEMORY DEVICES ON FRINGES OF CONTROL GATE

(75) Inventor: Chao-I Wu, Zhubei (TW)

(73) Assignee: Macronix International Co., Ltd., Hsinchu (TW)

(*) Notice: Subject to any disclaimer, the term of this patent is extended or adjusted under 35 U.S.C. 154(b) by 157 days.

(21) Appl. No.: 11/614,905

(22) Filed: Dec. 21, 2006

(65) Prior Publication Data
US 2007/0297241 A1      Dec. 27, 2007

Related U.S. Application Data

(60) Provisional application No. 60/805,448, filed on Jun. 21, 2006.

(51) Int. Cl.
  *G11C 11/34* (2006.01)
(52) U.S. Cl. .................... 365/185.25; 365/185.03; 365/185.18
(58) Field of Classification Search ............ 365/185.25, 365/185.03, 185.18, 185.26, 185.27
See application file for complete search history.

(56) References Cited

U.S. PATENT DOCUMENTS

| | | | |
|---|---|---|---|
| 5,315,145 A | 5/1994 | Lukaszek | |
| 5,319,229 A | 6/1994 | Shimoji et al. | |
| 5,347,153 A * | 9/1994 | Bakeman, Jr. ............... | 257/345 |
| 5,877,524 A | 3/1999 | Oonakado et al. | |
| 6,011,725 A | 1/2000 | Eitan | |
| 6,172,368 B1 | 1/2001 | Tarr et al. | |
| 6,172,397 B1 | 1/2001 | Oonakado et al. | |
| 6,320,786 B1 | 11/2001 | Chang et al. | |
| 6,487,114 B2 | 11/2002 | Jong et al. | |
| 6,576,922 B1 | 6/2003 | Ma et al. | |
| 6,853,587 B2 * | 2/2005 | Forbes .................... | 365/185.28 |
| 7,139,200 B2 | 11/2006 | Wu et al. | |
| 7,269,071 B2 * | 9/2007 | Prall et al. ............. | 365/185.24 |
| 7,471,568 B2 * | 12/2008 | Wu ........................ | 365/185.24 |
| 2004/0268025 A1 | 12/2004 | Matsubara et al. | |
| 2005/0111257 A1 | 5/2005 | Eitan | |

(Continued)

OTHER PUBLICATIONS

U.S. Appl. No. 60/805,445, filed Jun. 21, 2006 by inventor Chao-I Wu entitled "*Multi-Level Cell Memory Structures with Enlarged Second Bit Operation Window*".
Man, T., et al., "An Highly Scalable Double Density Nonvolatile Memory Cell Using Two Electrically Isolated Oxide-Nitride-Oxide Charge Storage Stacks." IEEE 2003 (pp. 51-54).

(Continued)

*Primary Examiner*—Tuan T Nguyen
*Assistant Examiner*—Hien N Nguyen
(74) *Attorney, Agent, or Firm*—Haynes Beffel & Wolfeld LLP

(57) ABSTRACT

Charge trapping memory devices and methods are included for increasing a second bit operation window by a fringe-induced effect. The fringe-induced effect occurs in areas underneath a word line so that when a hole injection method is applied to a memory device, hole charges are stored in a charge trapping layer that intersects with a word line and the hole charges are stored along fringes of the word line. In one embodiment, a virtual ground array includes a charge trapping layer that is disposed between two dielectrics such that there is not a charge trapping layer over source and drain regions. After a hole injection is applied to the virtual ground array, hole charges are stored along fringes of each word line given the fringes of the word line has a larger electrical field relative to non-fringe areas of the word line.

20 Claims, 16 Drawing Sheets

U.S. PATENT DOCUMENTS

| | | |
|---|---|---|
| 2005/0226054 A1 | 10/2005 | Yeh et al. |
| 2006/0141709 A1* | 6/2006 | Lung et al. .................. 438/261 |
| 2006/0164884 A1 | 7/2006 | Wu |
| 2007/0081387 A1 | 4/2007 | Lung |
| 2007/0138539 A1* | 6/2007 | Wu et al. ..................... 257/324 |
| 2007/0297227 A1* | 12/2007 | Wu ........................ 365/185.03 |
| 2007/0297240 A1* | 12/2007 | Wu ........................ 365/185.24 |

OTHER PUBLICATIONS

Roizin, Y., et al., "Plasma-Induced Charging in Two Bit Per Cell SONOS Memories." IEEE 2003 (pp. 61-64).

Liou, J., et al., "Characterization of Process-Induced Mobile Ions on the Data Retention in Flash Memory," IEEE Transactions on Electron Devices, vol. 50, No. 4 (pp. 995-1000) Apr. 2003.

* cited by examiner

METHOD AND STRUCTURE FOR OPERATING MEMORY DEVICES ON FRINGES OF CONTROL GATE

REFERENCE TO RELATED APPLICATION

This application claims the benefit of U.S. Provisional Patent Application No. 60/805,448, filed 21 Jun. 2006 by inventor Chao-I Wu, entitled Method and Structure for Operating Memory Devices on Fringes of Control Gate.

BACKGROUND OF THE INVENTION

1. Field of the Invention

The present invention relates generally to electrically programmable and erasable memory, and more particularly, to methods and devices for increasing a memory operation window and reducing a second bit effect in multi-bit-per-cell operations.

2. Description of Related Art

Electrically programmable and erasable nonvolatile memory technologies based on charge trapping structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a nonvolatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Charge trapping memory devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of a charge trapping memory flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious as the technology keeps scaling down.

A traditional floating gate device stores 1 bit of charge in a conductive floating gate. The advent of charge trapping memory cells provides the ability to store 2 bits of flash cells in an Oxide-Nitride-Oxide (ONO) dielectric. In a typical structure of an charge trapping memory cell, a nitride layer is used as a trapping material positioned between a top oxide layer and a bottom oxide layer. The charge in the ONO dielectric with a nitride layer may be either trapped on the left side or the right side of a charge trapping memory cell. The intrinsic issue of second bit effect affects the operation window. The second bit effect is caused by the interaction of a left bit and a right bit in the charge trapping memory cell. Therefore, it is desirable to have methods and devices that increase a memory operation window in a charge trapping memory so that the second bit effect is significantly reduced.

SUMMARY OF THE INVENTION

Charge trapping memory devices and methods are described for increasing a second bit operation window by fringe induced effect. The fringe induced effect occurs in areas underneath a word line so that when a hole injection method is applied to a memory device, hole charges are stored in a charge trapping layer that intersects with a word line and the holes charges are stored along fringes of the word line. In a first embodiment of the charge trapping memory, a virtual ground array comprises a charge trapping layer that is disposed between two dielectrics such that there is not a charge trapping layer over source and drain regions. After a hole injection method is applied to the virtual ground array, the hole charges are stored along fringes of each word line given that the fringes of the word line have a larger electrical field relative to non-fringe areas of the word line. The hole charges along a fringe causes the channel to have a lower voltage threshold Vt. A typical device operation of the virtual memory array is dominated by a low voltage threshold. In a second embodiment of the charge trapping memory, a virtual ground array comprises a charge trapping layer that extends over source and drain regions. Additional hole charges are injected into the charge trapping layer extends over source and drain regions.

In a third embodiment of the charge trapping memory, the virtual ground array comprises a charge trapping layer that is disposed between two dielectrics such that there is not a charge trapping layer over source and drain regions. The virtual ground array includes a plurality of word lines where each word line includes two fringes and a non-fringe area located between the two fringes. Each word line is associated with two voltage thresholds, a first voltage threshold ($Vt_{fringe}$) is associated with the two fringes of the word line, and a second voltage threshold ($Vt_{non-fringe}$) is associated with the non-fringe area of the word line. The fringe voltage threshold $Vt_{fringe}$ is typically lower than the non-fringe $Vt_{non-fringe}$ voltage threshold. In a fourth embodiment of the charge trapping memory, a virtual ground array comprises a charge trapping layer that extends over source and drain regions. Additional hole charges are injected into the charge trapping layer extends over source and drain regions. Similarly, each word line is associated with two voltage thresholds, a first voltage threshold ($Vt_{fringe}$) associated with the two fringes of the word line, and a second voltage threshold ($Vt_{non-fringe}$) associated with the non-fringe area of the word line. The fringe voltage threshold $Vt_{fringe}$ is typically lower than the non-fringe $Vt_{non-fringe}$ voltage threshold.

Broadly stated, a memory device comprises a substrate, a charge trapping structure overlying the substrate, the charge trapping structure extending in a first direction, and a gate electrode extending in a second direction and intersecting with the charge trapping layer, the gate electrode having a bottom surface defined by a first fringe that is spaced apart from a second fringe, and an non-fringe section between the first fringe and the second fringe, the non-fringe having a first voltage threshold, the first and second fringes having a second voltage threshold, the second voltage threshold being a lower value than the first voltage threshold, wherein holes are moved to the charge trapping layer by a hole injection, and positioned underneath and along the first and second fringes of the gate electrode.

A first hole injection method to increase a memory operation window in a two-bit-per-cell memory is described which applies a positive gate voltage, +Vg, to erase a memory cell to a negative voltage level. A second hole injection method, to increase the memory operation window in the two-bit-per cell memory, is described which includes applying a negative gate voltage, −Vg, to the two-bit-per-cell memory for erasing the charge trapping memory to a negative voltage level. Alternatively, the charge trapping memory is erased to a voltage level that is lower than an initial voltage threshold level, Vt(i). These two methods of erasing a charge trapping memory to either a negative voltage level or to a voltage level that is less than the initial voltage threshold level, can be implemented either before a programming step (i.e., a pre-program erase operation), or after a programming step (i.e., a post-program erase operation).

Two exemplary erase operations are illustrated in the following three embodiments for implementing the present invention. The two erase operations include a hole injection erase operation and a band-to-band hot hole erase operation. In a first embodiment, the charge trapping memory is erased using a hole injection by a hole tunneling erase with a positive voltage. In a second embodiment, the charge trapping memory is erased using a hole injection by a hole tunneling erase with a negative voltage. In a third embodiment, the charge trapping memory is erased using a band-to-band hot hole operation. A programming technique that is suitable for operation with these erase operations of a charge trapping memory includes a channel hot electron (CHE).

The methods of the present invention are applied to a wide variety of memory devices that have a charge trapping structure, including but not limited to memory devices having a nitride-oxide structure, an oxide-nitride-oxide structure, a nitride-oxide-nitride-oxide structure and an oxide-nitride-oxide-nitride-oxide structure. For example, in an MNOS memory device, a charge trapping layer overlies a dielectric layer without the presence of a dielectric layer that is disposed over the charge trapping layer. Instead, a poly layer is formed over the charge trapping layer. The nitride-oxide structure without a dielectric layer enables holes to be injected readily from the poly layer to the charge trapping layer.

Advantageously, the present invention increases the program and erase efficiency in a charge trapping memory device. In addition, the present invention expands the size of the second bit operation window.

The structures and methods of the present invention are disclosed in the detailed description below. This summary does not purport to define the invention. The invention is defined by the claims. These and other embodiments, features, aspects, and advantages of the invention will become better understood with reference to the following description, claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
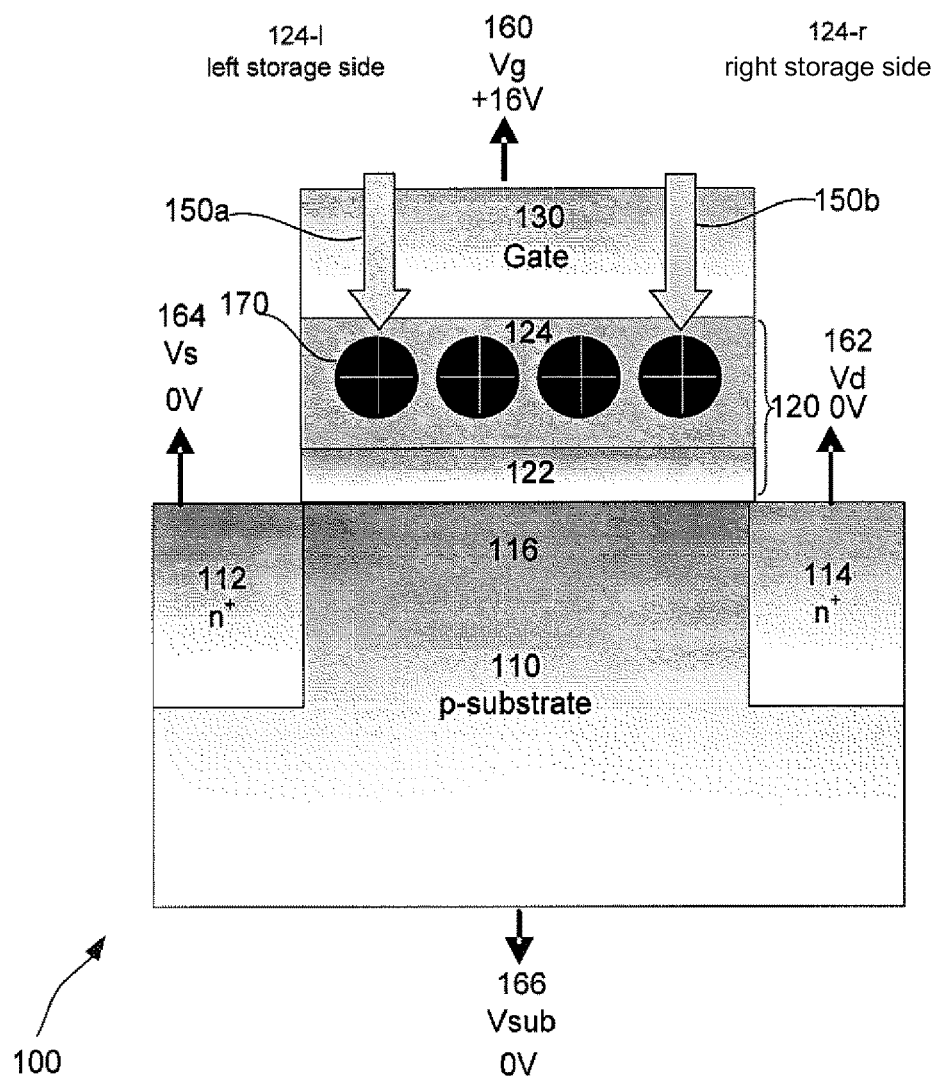
FIG. 1 illustrates a structural diagram in a first embodiment of a charge trapping memory cell that includes a nitride-oxide charge trapping structure without a top dielectric layer showing an erase operation of the charge trapping memory by a hole injection method by injecting holes from a gate terminal in accordance with the present invention.

A description of structural embodiments and methods of the present invention is provided with reference to FIGS. 1-12. It is to be understood that there is no intention to limit the invention to the specifically disclosed embodiments but that the invention may be practiced using other features, elements, methods and embodiments. Like elements in various embodiments are commonly referred to with like reference numerals.

FIG. 1 illustrates a structural diagram in a first embodiment of a charge trapping memory cell 100 that includes a nitride-oxide (NO) charge trapping structure 120 without a top dielectric layer showing an erase operation of the charge trapping memory by a hole injection method by injecting holes from a gate terminal. The charge trapping memory cell 100 comprises a p-substrate 110 with a source region 112 spaced apart from a drain region 114 with a channel 116 therebetween. The term "hole injection" is also referred to as "hole tunneling." The nitride-oxide charge trapping structure 120 has a charge trapping layer 124 overlying a dielectric layer 122, which is disposed over the p-substrate 110. The nitride-oxide charge trapping structure 120 does not have a top dielectric structure in this embodiment. A gate electrode 130 overlies the charge trapping layer 124 in the charge trapping structure 120. A wide variety of materials can be used to implement the gate electrode 130, including n-poly, p-poly and metal.

In this embodiment, a positive gate voltage +Vg 160 is applied to the gate electrode 130 to erase the charge trapping memory cell 100 to a negative voltage level or to a voltage level that is less than the initial voltage threshold level to effectuate a large memory operation window in the charge trapping memory cell 100, which has a left memory storage side 124-l in the left side of the charge trapping layer 124 and a right memory storage side 124-r in the right side of the charge trapping layer 124. This erase method can be implemented either before a programming step (i.e., a pre-program erase operation), or after a programming step (i.e., a post-program erase operation).

When a high bias voltage is applied to a gate terminal in the gate electrode 130, holes 170 are injected from the gate terminal (as indicated by arrows 150a, 150b) to the charge trapping layer 124. As exemplary voltage levels, the gate voltage Vg 160 is applied with a positive voltage of 16 volts, a drain voltage Vd 162 is applied with 0 volts, a source voltage Vs 164 is applied with 0 volts, and a substrate voltage Vsub 166 is applied with 0 volts. The combination of these applied voltages results in hole tunneling erase of the charge trapping memory cell 100 to the negative voltage threshold −Vt, thereby increasing a memory operational window and reducing the second hit effect.

The nitride-oxide charge trapping structure 120 in the charge trapping memory cell 100 is intended as an illustration. The charge trapping memory cell 100 comprises the nitride-oxide charge trapping structure 120 without a top oxide, which advantageously allows holes to enter directly into the charge trapping structure 120 without the presence of a top oxide. The nitride-oxide charge trapping structure 120 in the charge trapping memory cell 100 can be implemented in memories like metal oxide nitride oxide semiconductor (MNOS) or silicon nitride oxide semiconductor (SNOS). Other combinations of charge trapping structures, such as oxide-nitride-oxide (ONO), or oxide-nitride-oxide-nitride-oxide (ONONO) stack can be implemented without departing from the spirit of the present invention.

Figure 2:
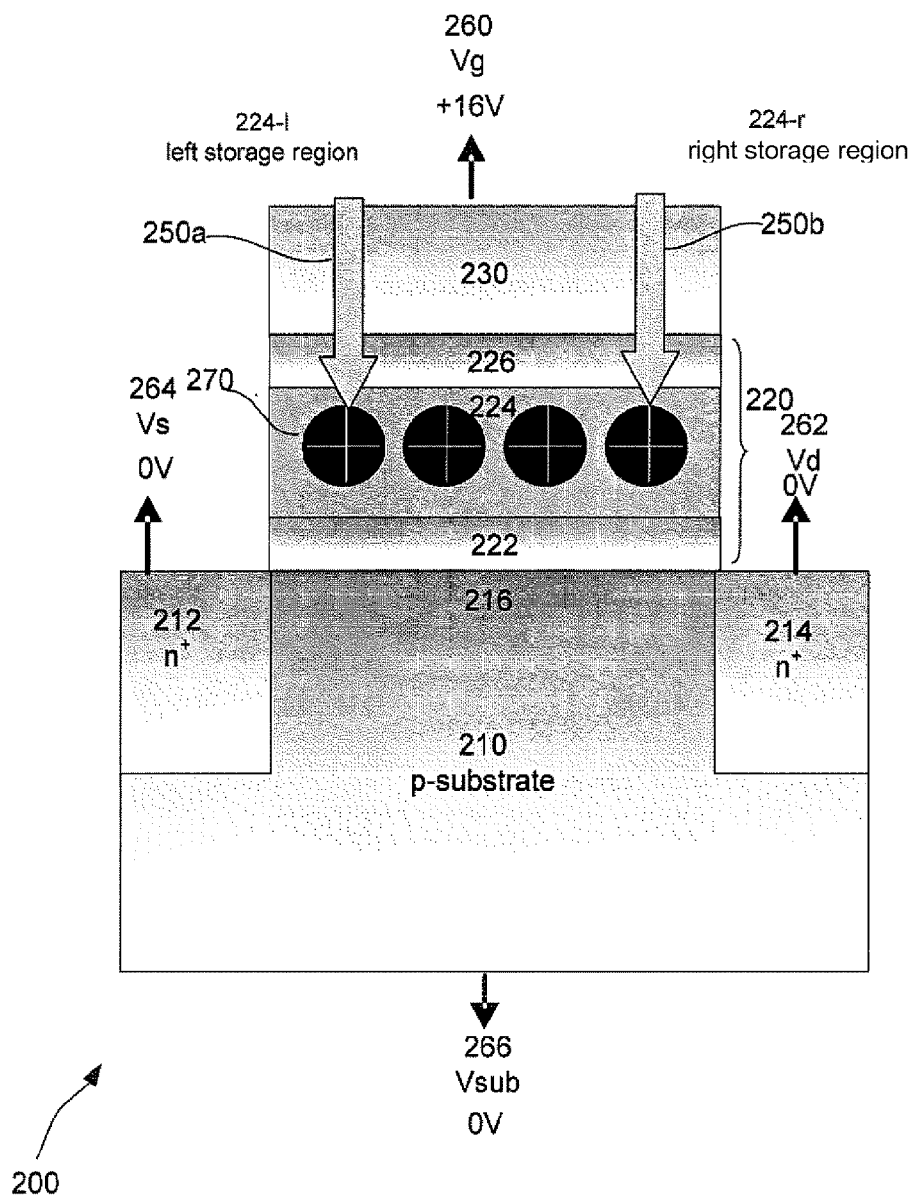
FIG. 2 is a structural diagram illustrating a second embodiment of the charge trapping memory that includes an oxide-nitride-oxide charge trapping structure with a selected top dielectric layer to allow hole injection from a gate terminal in accordance with the present invention.

FIG. 2 is a structural diagram illustrating a second embodiment of the charge trapping memory 200 that includes an oxide-nitride-oxide (ONO) charge trapping structure 220 with a selected top dielectric layer to allow hole injection from a gate terminal. The charge trapping memory cell 200 comprises a p-substrate 210 with a source region 212 spaced apart from a drain region 214 with a channel 216 therebetween. The nitride-oxide charge trapping structure 120 has a top dielectric layer 226 overlying a charge trapping layer 224, with the charge trapping layer 224 overlying a bottom dielectric layer 222, which is disposed over the p-substrate 210. A gate electrode 230 overlies the top dielectric layer 226 in the charge trapping structure 120. A wide variety of materials can be used to implement the gate electrode 130, including n-poly, p-poly and metal.

In this embodiment, a positive gate voltage +Vg 260 is applied to the gate electrode 230 to erase the charge trapping memory cell 200 to a negative voltage level or to a voltage level that is less than the initial voltage threshold level to effectuate a large memory operation window in the charge trapping memory cell 200, which has a left memory storage side 224-l in the left side of the charge trapping layer 124 and a right memory storage side 224-r in the right side of the charge trapping layer 124. This erase method can be implemented either before a programming step (i.e., a pre-program erase operation), or after a programming step (i.e., a post-program erase operation).

When a high bias voltage is applied to a gate terminal in the gate electrode 230, holes 270 are injected from the gate terminal to the charge trapping layer 224, as indicated by arrows 250a, 250b. The top dielectric layer 226 may be selected to be sufficiently thin for hole tunneling through the top dielectric layer 214. As exemplary voltage levels, the gate voltage Vg 260 is applied with a positive voltage of 16 volts, a drain voltage Vd 262 is applied with 0 volts, a source voltage Vs 264 is applied with 0 volts, and a substrate voltage Vsub 266 is applied with 0 volts. The combination of these applied voltages results in hole tunneling erase of the charge trapping memory cell 200 to the negative voltage threshold −Vt, thereby increasing a memory operational window and reducing the second bit effect.

The oxide-nitride-oxide charge trapping structure 220 in the charge trapping memory cell 200 is intended as an illustration. The oxide-nitride-oxide charge trapping structure 220 in the charge trapping memory cell 200 can be implemented in memories like metal oxide-nitride-oxide semiconductor (MONOS) or silicon nitride oxide semiconductor (SONOS).

Other combinations of charge trapping structures, such as oxide-nitride-oxide-nitride-oxide stack, can be implemented without departing from the spirit of the present invention.

Figure 3:
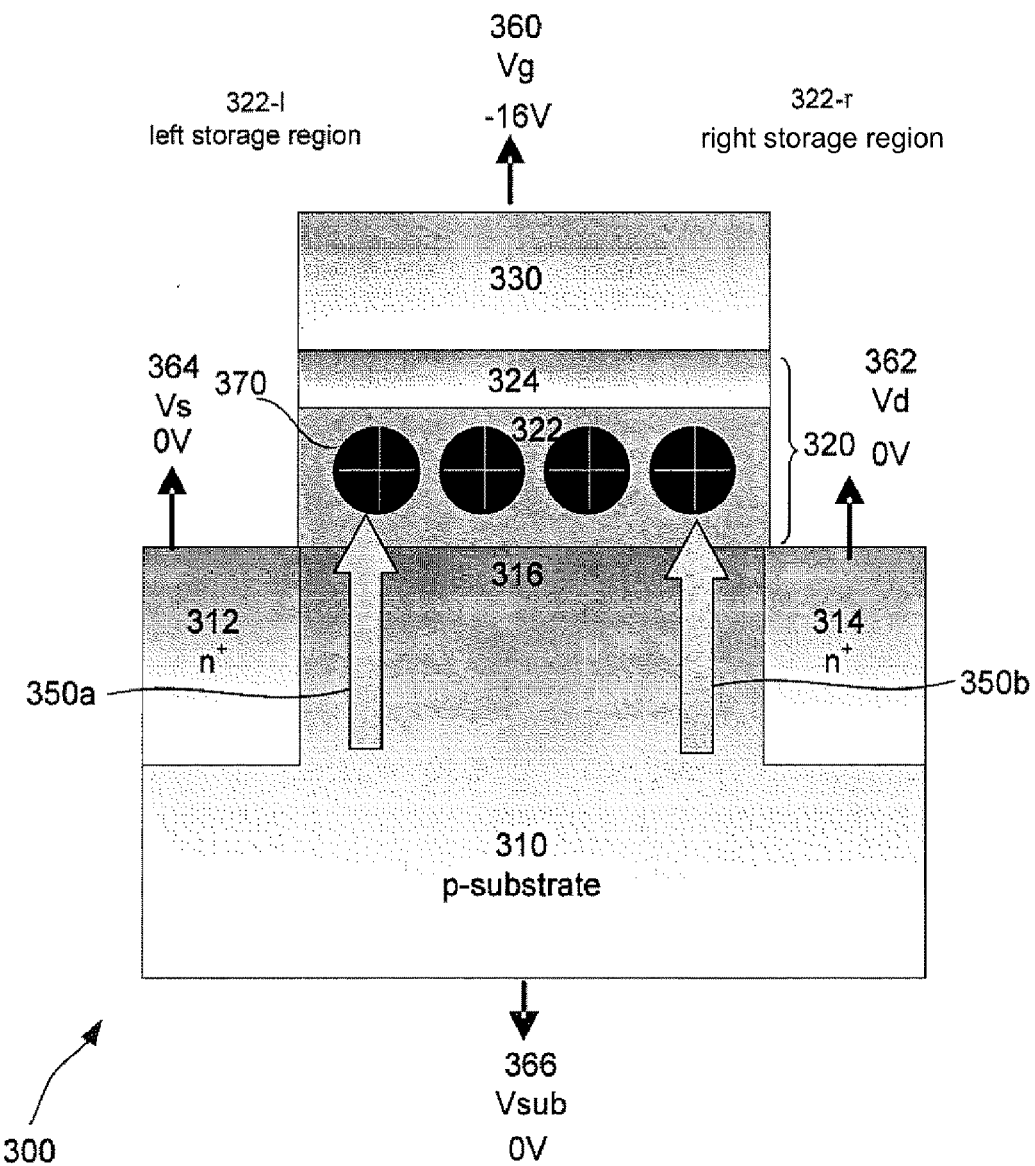
FIG. 3 is a structural diagram illustrating a third embodiment of the charge trapping memory cell that includes an oxide-nitride charge trapping structure without a bottom dielectric layer to allow hole injection from the substrate in accordance with the present invention.

FIG. 3 is a structural diagram illustrating a third embodiment of the charge trapping memory cell 300 that includes an oxide-nitride (ON) charge trapping structure 320 without a bottom dielectric layer to allow hole injection from the substrate. The charge trapping memory cell 300 comprises a p-substrate 310 with a source region 312 spaced apart from a drain region 314 with a channel 316 therebetween. The nitride-oxide charge trapping structure 120 has a dielectric layer 324 overlying a charge trapping layer 322, which is disposed over the p-substrate 110. The oxide-nitride charge trapping structure 320 does not have a bottom dielectric structure in this embodiment. A gate electrode 330 overlies the charge trapping layer 322 in the charge trapping structure 320. A wide variety of materials can be used for the gate electrode 330, including n-poly, p-poly and metal.

In this embodiment, a negative gate voltage −Vg 360 is applied to the gate electrode 330 to erase the charge trapping memory cell 300 to a negative voltage level or to a voltage level that is less than the initial voltage threshold level to effectuate a large memory operation window in the charge trapping memory cell 300, which has a left memory storage side 322-l in the left side of the charge trapping layer 322 and a right memory storage side 322-r in the right side of the charge trapping layer 322. This erase method can be implemented either before a programming step (i.e., a pre-program erase operation), or after a programming step (i.e., a post-program erase operation).

When a high bias voltage is applied to a gate terminal in the gate electrode 330, holes 370 are injected from the substrate to the charge trapping layer 322, as indicated by arrows 350a, 350b. As exemplary voltage levels, the gate voltage —Vg 360 is applied with a positive voltage of −16 volts, a drain voltage Vd 362 is applied with 0 volts, a source voltage Vs 364 is applied with 0 volts, and a substrate voltage Vsub 366 is applied with 0 volts. The combination of these applied voltages results in hole tunneling erase of the charge trapping memory cell 300 to the negative voltage threshold −Vt, thereby increasing a memory operational window and reducing the second bit effect.

The oxide-nitride charge trapping structure 320 in the charge trapping memory cell 300 is intended as an illustration. The charge trapping memory cell 300 has the oxide-nitride charge trapping structure 320 without a bottom oxide, which advantageously allows holes to enter directly into the charge trapping structure 320 without the presence of a bottom oxide. The oxide-nitride charge trapping structure 320 in the charge trapping memory cell 300 can be implemented in memories like metal oxide nitride oxide semiconductor (MONS) or silicon nitride oxide semiconductor (SONS). Other combinations of charge trapping structures, such as oxide-nitride-oxide, or oxide-nitride-oxide-nitride-oxide stack can be implemented without departing from the spirit of the present invention.

Figure 4:
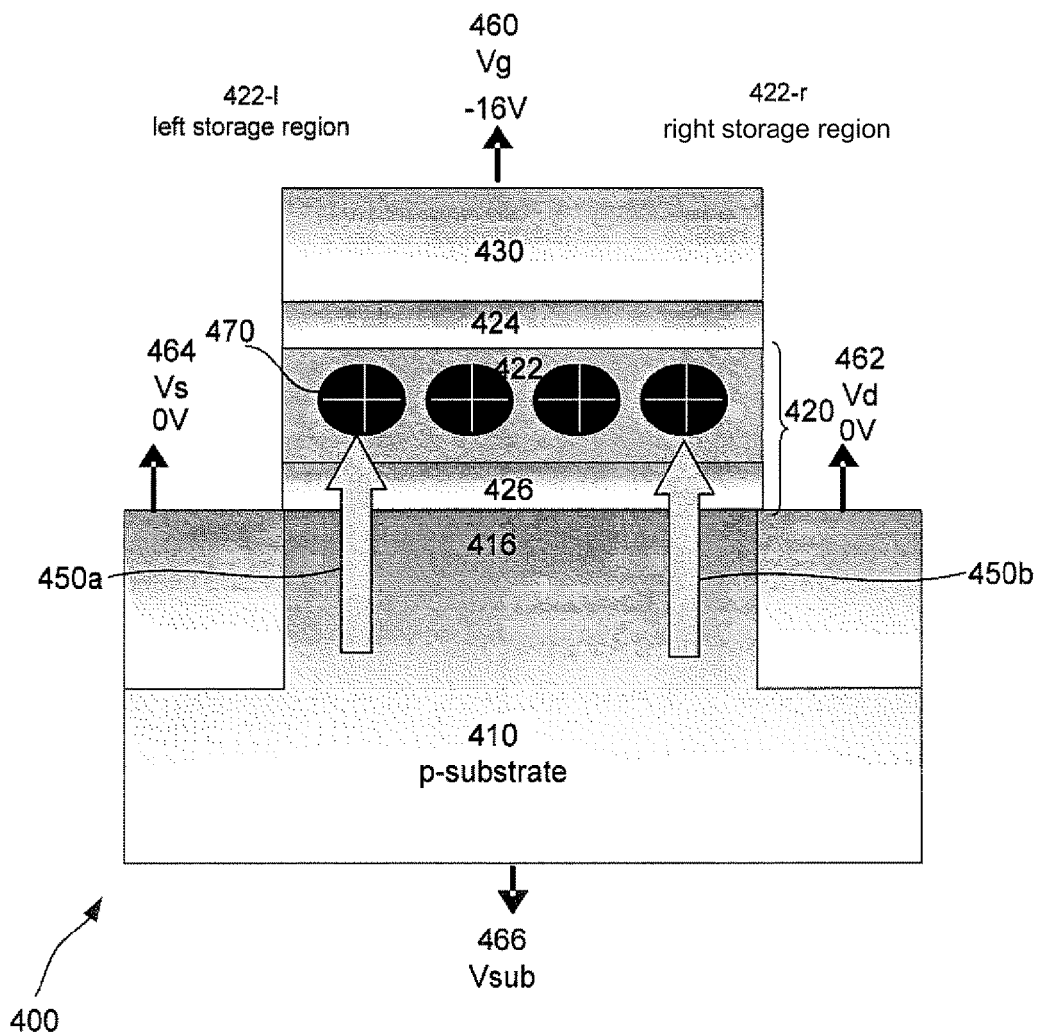
FIG. 4 is a structural diagram illustrating a fourth embodiment of the charge trapping memory that includes an oxide-nitride-oxide charge trapping structure with a selected bottom dielectric layer to allow hole injection from the substrate in accordance with the present invention.

FIG. 4 is a structural diagram illustrating a fourth embodiment of the charge trapping memory 400 that includes an oxide-nitride-oxide charge trapping structure 420 with a selected bottom dielectric layer to allow hole injection from substrate. The charge trapping memory cell 400 comprises a p-substrate 410 with a source region 412 spaced apart from a drain side 414 with a channel 416 therebetween. The oxide-nitride-oxide charge trapping structure 420, disposed over the p-substrate 410, has a top dielectric layer 424 overlying a charge trapping layer 422 and the charge trapping layer 422 overlying a bottom dielectric layer 426. A gate electrode 430 overlies the top dielectric layer 424 in the charge trapping structure 320. A wide variety of materials can be used to implement the gate electrode 330, including n-poly, p-poly and metal.

In this embodiment, a negative gate voltage −Vg 460 is applied to the gate electrode 430 to erase the charge trapping memory cell 400 to a negative voltage level or to a voltage level that is less than the initial voltage threshold level to effectuate a large memory operation window in the charge trapping memory cell 400, which has a left memory storage side 422-l in the left side of the charge trapping layer 422 and a right memory storage side 422-r in the right side of the charge trapping layer 422, This erase method can be implemented either before a programming step (i.e., a pre-program erase operation), or after a programming step (i.e., a post-program erase operation).

When a high bias voltage is applied to a gate terminal in the gate electrode 430, holes 470 are injected from the substrate to the charge trapping layer 422, as indicated by arrows 450a, 450b. The bottom dielectric layer 426 may be selected to be sufficiently thin for hole tunneling through the bottom dielectric layer 426. As exemplary voltage levels, the gate voltage −Vg 460 is applied with a negative voltage of −16 volts, a drain voltage Vd 462 is applied with 0 volts, a source voltage Vs 464 is applied with 0 volts, and a substrate voltage Vsub 466 is applied with 0 volts. The combination of these applied voltages results in hole tunneling erase of the charge trapping memory cell 400 to the negative voltage threshold −Vt, thereby increasing a memory operational window and reducing the second bit effect.

The oxide-nitride-oxide charge trapping structure 420 in the charge trapping memory cell 300 is intended as an illustration. The oxide-nitride-oxide charge trapping structure 420 in the charge trapping memory cell 300 can be implemented in memories like metal oxide nitride oxide semiconductor (MONOS) or silicon nitride oxide semiconductor (SONOS).

Other combinations of charge trapping structures, such as oxide-nitride-oxide-nitride-oxide (ONONO) stack can be implemented without departing from the spirit of the present invention. Representative dielectric layers 122, 222, 226, 324, 424, and 426 include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 30 nanometers, or other similar high dielectric constant materials, including metal oxides such as $Al_2O_3$, $HfO_2$, $CeO_2$, and others. The charge trapping structure may be a discontinuous set of pockets or particles of charge trapping material, or a continuous layer as shown in the drawing. The charge trapping structure 120 traps charges like electron charges or hole charges.

Figure 5A:
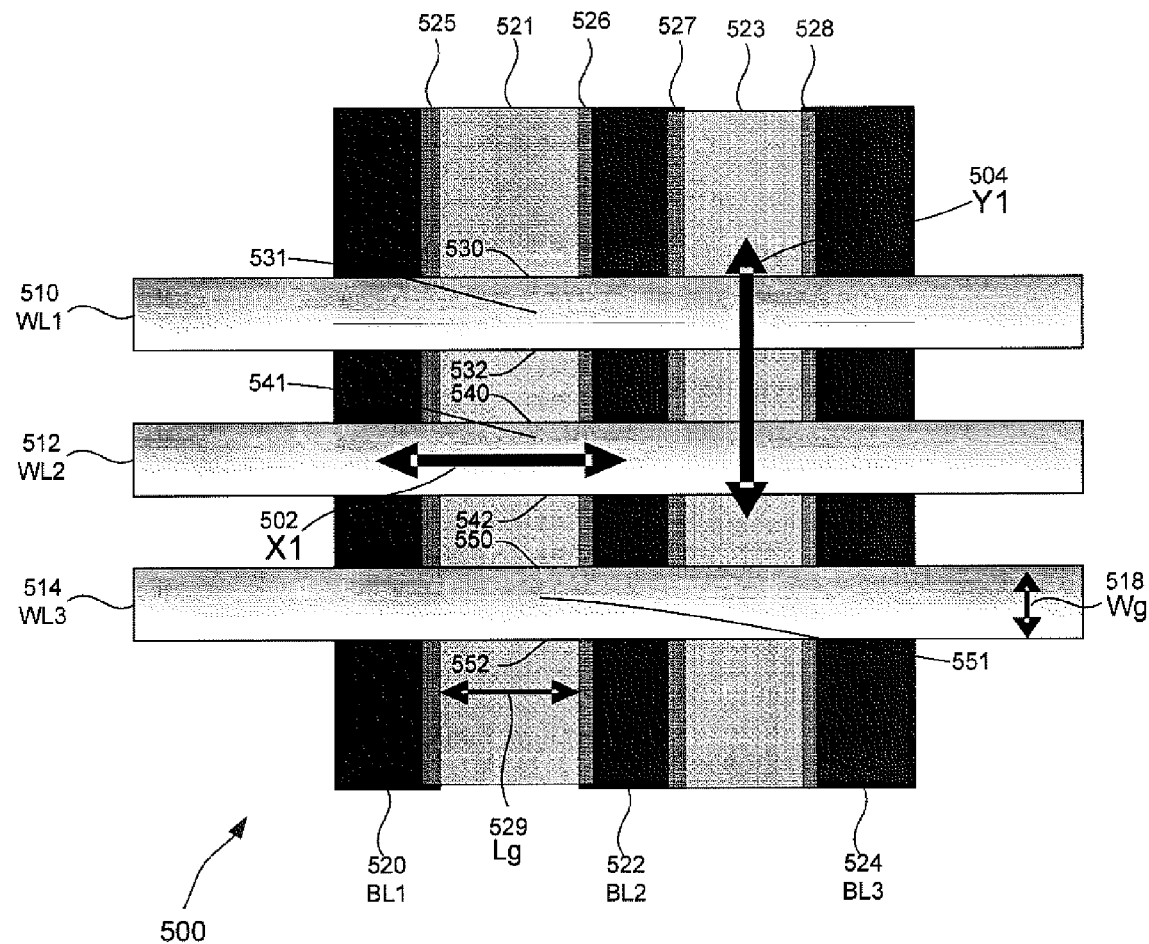
FIG. 5A is a structural diagram illustrating a top view in a first embodiment of a virtual ground array before a hole charge injection method is implemented on an MNOS memory in accordance with the present invention.

FIG. 5A is a structural diagram illustrating a top view in a first embodiment of a virtual ground array 500 before a hole charge injection method implemented on a MNOS memory. The virtual ground array 500 comprises a plurality of word lines (gates) WL1 510, WL1 512 and WL2 514 extending in a horizontal direction, as shown by an arrow X1 502. Each of the WL1 510, WL1 512 and WL2 514 has a width, represented by a symbol Wg 518. The virtual ground array 500 also includes a plurality of bit lines BL1 520, BL2 522 and BL3 524, with a first charge trapping portion 521 disposed between the bit lines BL1 520, BL2 522, and a second charge trapping portion 523 disposed between the bit lines BL2 522, BL3 524, where they extend in a vertical direction, as shown by an arrow Y1 504. Each of the charge trapping portions 521, 523 has a length, represented by a symbol Lg 529. The first charge trapping portion 521 and the second charge trapping portion 523 are part of a charge trapping layer. In the intersection of the first charge trapping portion 521 and the first, second, third word lines WL1 510, WL2 512, WL3 514, a first dielectric strip 525 and a second dielectric strip 526 extend vertically on each side of the first charge trapping portion 521. In the intersection of the second charge trapping portion 523 and the first, second, third word lines WL1 510, WL2 512, WL3 514, a third dielectric strip 527 and a fourth dielectric strip 528 extend vertically on each side of the second charge trapping portion 523.

The first word line WL1 510 has a first fringe 530 and a second fringe 532 with a non-fringe area 531. Embodiments of the invention refer to the non-fringe area 531 as an area that is away from the first fringe 530 and away from the second fringe 532 and may be substantially near the center 531, which is between the first fringe 530 and the second fringe 532. The second word line WL2 512 has a first fringe 540 and a second fringe 542 with a non-fringe area 541. Embodiments of the invention refer to the non-fringe area 541 as an area that is away from the first fringe 540 and away from the second fringe 542 and may be substantially near the center 541, which is between the first fringe 540 and the second fringe 542. The third word line WL3 514 has a first fringe 550 and a second fringe 552 with a non-fringe area 551. Embodiments of the invention refer to the non-fringe area 551 as an area that is away from the first fringe 550 and away from the second fringe 552 and may be substantially near the center 551, which is between the first fringe 550 and the second fringe 552. The virtual ground array 500 has not had a fringe induced effect because the hole charge injection has not been applied to the virtual ground array 500.

Figure 5B:
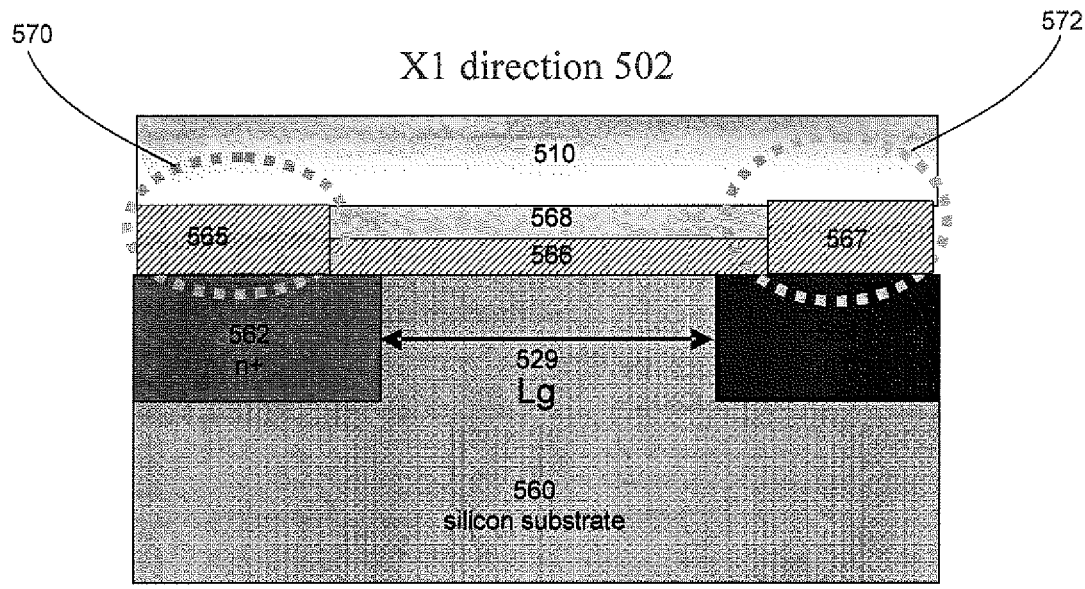
FIG. 5B illustrates a perspective view of the virtual ground array in the X1 direction without a charge trapping layer on source and drain junctions in accordance with the present invention.

FIG. 5B illustrates a perspective view of the virtual ground array 500 in the X1 direction 502 without a charge trapping layer on source and drain junctions. The virtual ground array 500 comprises a substrate 560 with a source region (n+) 562 that is spaced apart from a drain region 564 (n+) by the channel length Lg 529. In this embodiment, a charge trapping layer 568 neither extends all the way to the left to align with the left side of the substrate nor extends all the way to the right to align with the right side of the substrate. Rather, the charge trapping layer 568 is disposed on the left with a first dielectric section 565 and on the right with a second dielectric section 567. The first dielectric section 565 has the bottom surface in contact with the top surface of the source regopm 562 and therefore provides no charge trapping layer, as shown by a dotted circle 570. The second dielectric section 567 has the bottom surface in contact with the top surface of the drain region 564 and therefore provides no charge trapping layer, as shown by a dotted circle 572. A dielectric layer 566 also extends between the first and second dielectric sections 565, 567 and underlying the charge trapping layer 568.

Figure 5C:
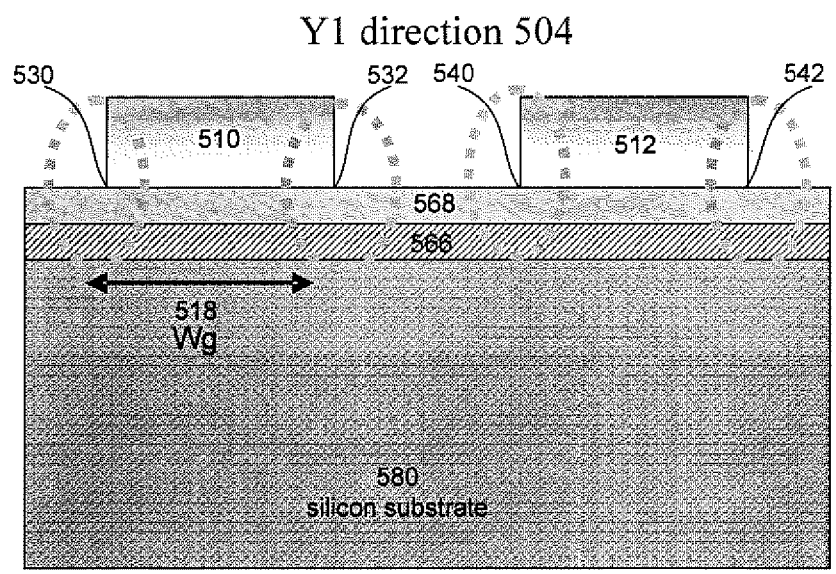
FIG. 5C illustrates a perspective view of the virtual ground array in the Y1 direction with the charge trapping layer on fringes of word lines in accordance with the present invention.

FIG. 5C illustrates a perspective view of the virtual ground array 500 in the Y1 direction 504 with the charge trapping layer 568 on fringes of word lines. As observed from the Y1 direction 504, the first word line WL1 510 and the second word line WL2 512 have bottom surfaces that are in contact with the charge trapping layer 568. The charge trapping layer 568 has a top surface that is in contact with the first and second fringes 530, 532 of the first word line 510 and that is in contact with the first and second fringes 540, 542 of the second word line 512.

Figure 6A:
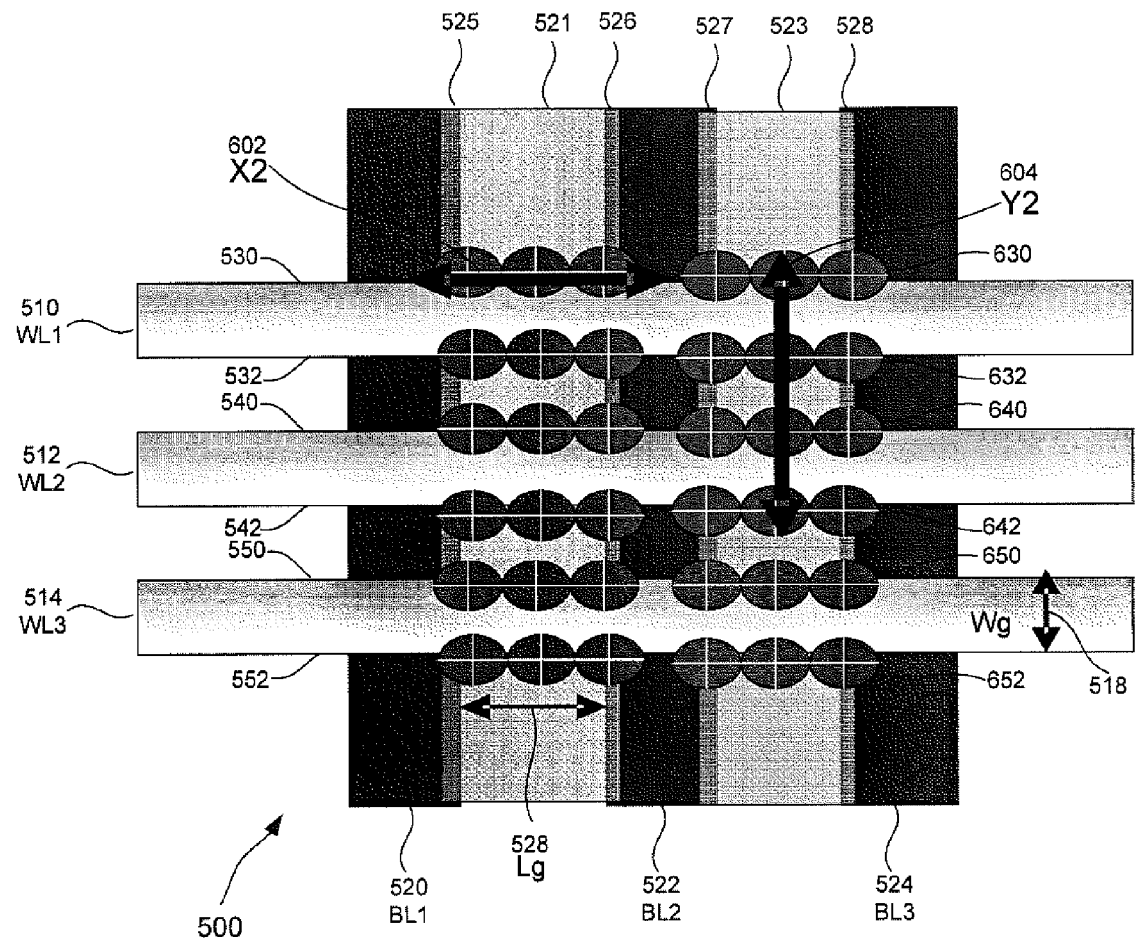
FIG. 6A is a structural diagram illustrating a top view in the first embodiment of the virtual ground array after a hole charge injection method has been applied.

FIG. 6A is a structural diagram illustrating a top view in the first embodiment of the virtual ground array 500 after a hole charge injection method. After the hole charge injection method is performed, hole charges are stored along fringes of each word line because the fringes have a large electrical field in comparison to near the center of each word line. A plurality of hole charges 630 are stored along the first fringe 530 in the first word line WL1 510 and intersect with the first charge trapping portion 521 and the second charge trapping portion 523. Hole charges are also stored along the other fringe of the word line. More specifically, a plurality of hole charges 632 are stored along the second fringe 532 in the first word line WL1 510 and intersects with the first charge trapping portion 521 and the second charge trapping portion 523. With respect to the second word line WL2 512, a plurality of hole charges 640 is stored along the first fringe 540 in the second word line WL2 512 and intersects with the first charge trapping portion 521 and the second charge trapping portion 523. A plurality of hole charges 642 are stored along the second fringe 542 in the second word line WL2 512 and intersects with the first charge trapping portion 521 and the second charge trapping portion 523. As for the third word line WL3 514, a plurality of hole charges 650 are stored along the first fringe 550 in the third word line WL3 514 and intersects with the first charge trapping portion 521 and the second charge trapping portion 523. A plurality of hole charges 652 are stored along the second fringe 552 in the third word line WL3 514 and intersects with the first charge trapping portion 521 and the second charge trapping portion 523. The first fringe 530 and the second fringe 532 in the first word line WL1 510, as well as other fringes in other word lines, enhance a drain induced barrier lowering (DIBL) effect to produce a larger second bit operation window.

Figure 6B:
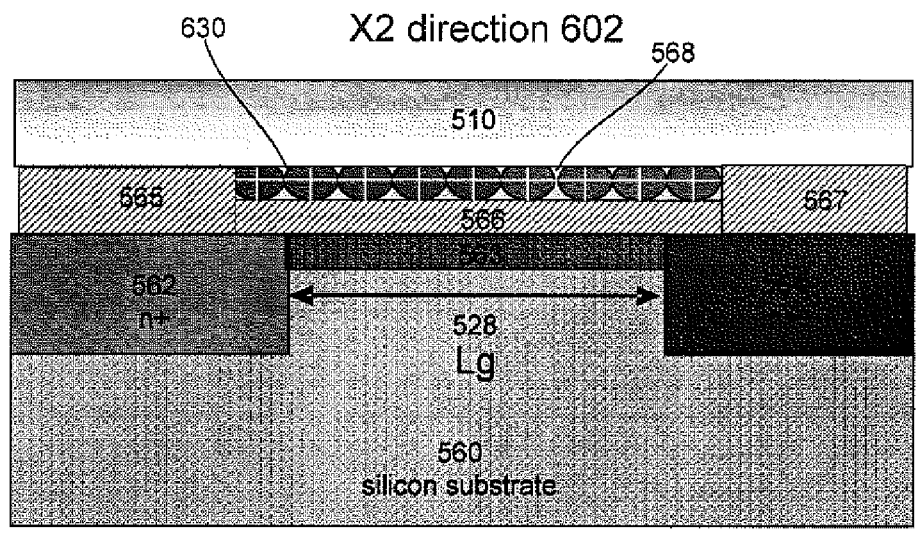
FIG. 6B illustrates a perspective view of the virtual ground array with the hole charges stored on the charge trapping layer in the X2 direction.

FIG. 6B illustrates a perspective view of the virtual ground array 500 with the hole charges 630 stored on the charge trapping layer 568 in the X2 direction 602. The hole charges 630 cause a fringe or induced channel 563 to have a lower voltage threshold level. The induced channel 563 results in the virtual ground array 500 being turned on such that the source and drain regions 562, 564 are conducting. The voltage threshold Vt typically dominates the device operation of the virtual ground array 500.

Figure 6C:
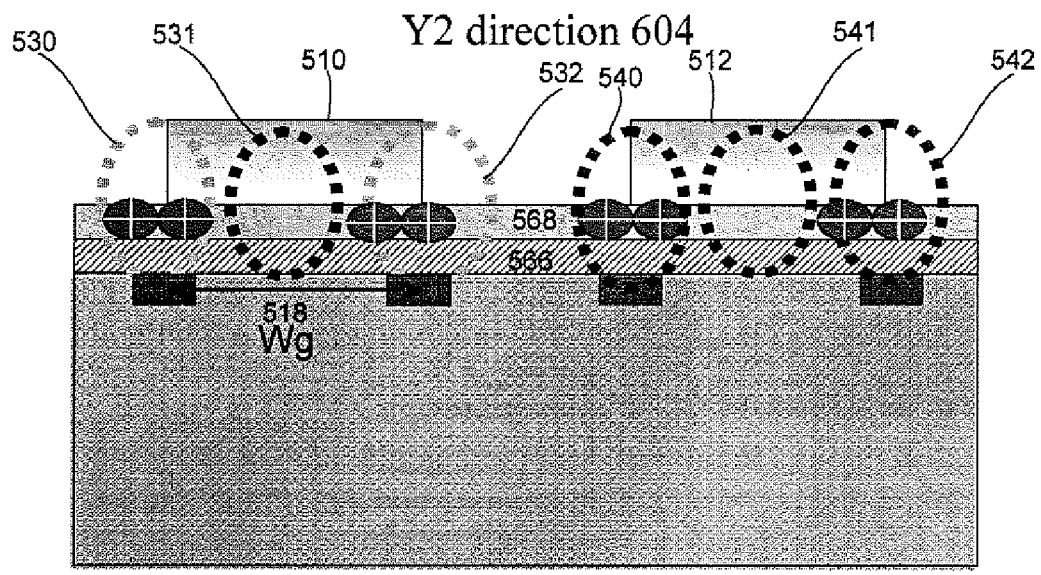
FIG. 6C illustrates a perspective view of the virtual ground array in the Y2 direction with a charge trapping layer on the fringes of word lines in accordance with the present invention.

FIG. 6C illustrates a perspective view of the virtual ground array 500 in the Y2 direction 604 with a charge trapping layer on the fringes of word lines. As shown in the Y2 direction 604, the first word line WL1 510 and the second word line WL2 512 have bottom surfaces that are in contact with the charge trapping layer 568. The charge trapping layer 568 has a top surface that is in contact with the first and second fringes 530, 532 of the first word line 510 and in contact with the first and second fringes 540, 542 of the second word line 512. The non-fringe area 531 in the charge trapping layer and underneath the first word line 510 does not store hole charges. Similarly, the non-fringe area 541 in the charge trapping layer and underneath the first word line 510 does not store hole charges.

Figure 7A:
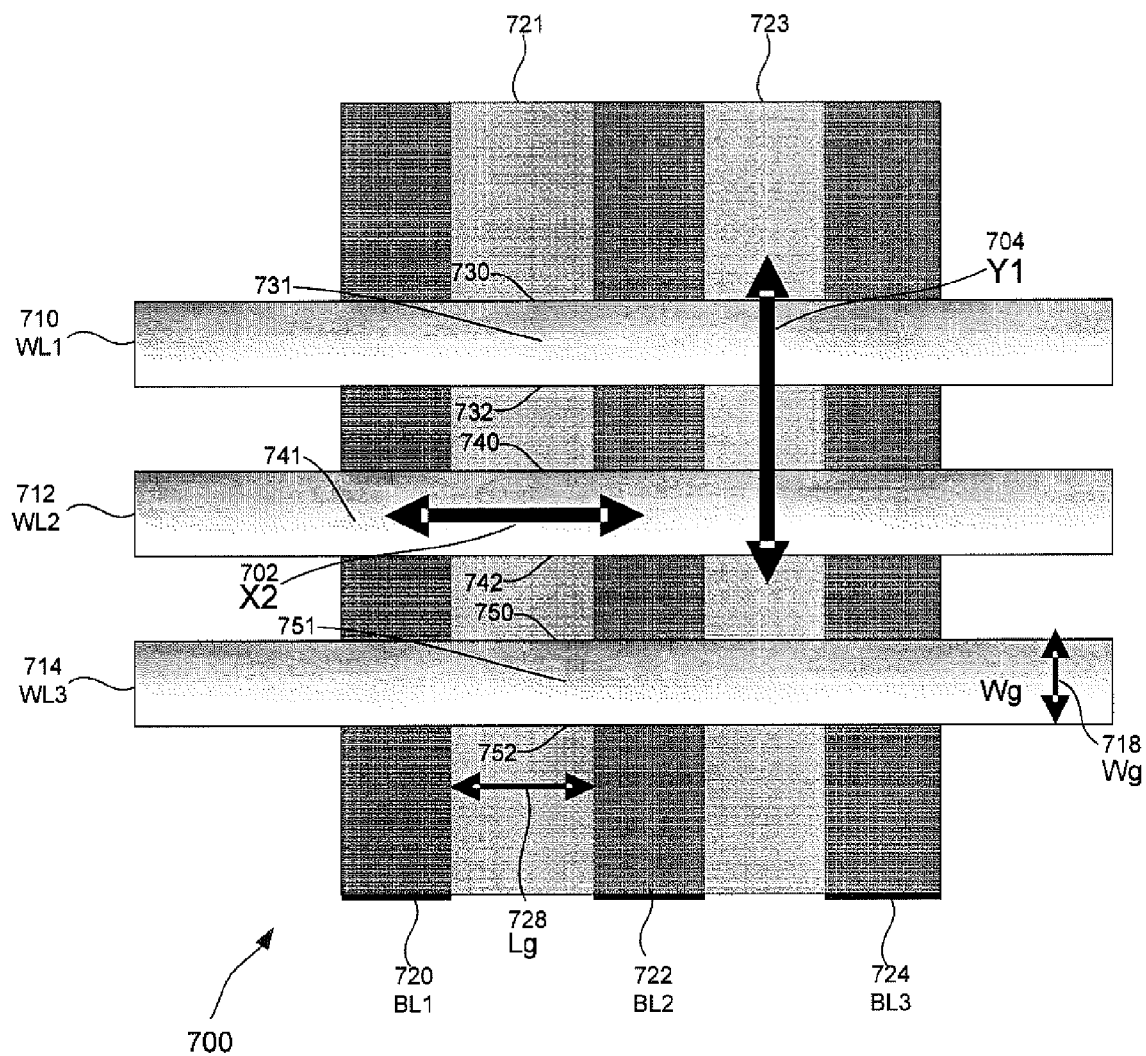
FIG. 7A is a structural diagram illustrating a top view in a second embodiment of a virtual ground array before a hole charge injection method is implemented on an MNOS memory in accordance with the present invention.

FIG. 7A is a structural diagram illustrating a top view in a second embodiment of a virtual ground array 700 before a hole charge injection method is implemented on a MNOS memory. The virtual ground array 700 comprises a plurality of word lines (gates) WL1 710, WL2 712 and WL3 714 extending in a horizontal direction, as shown by an arrow X2 702. Each of WL1 710, WL2 712 and WL3 714 has a width, represented by a symbol Wg 718. The virtual ground array 700 also includes a plurality of bit lines BL1 720, BL2 722 and BL3 724, with a first charge trapping portion 721 disposed between the bit lines BL1 720, BL2 722, and a second charge trapping portion 723 disposed between the bit lines BL2 722, BL3 724, where they extend in a vertical direction, as shown by an arrow Y1 704. Each of the charge trapping portions 721, 723 has a length, represented by a symbol Lg 728. The first charge trapping portion 721 and the second charge trapping portion 723 are part of a charge trapping layer.

The first word line WL1 710 has a first fringe 730 and a second fringe 732 with a non-fringe area 731. In other embodiments, the non-fringe area 731 as an area that is away from the first fringe 730 and away from the second fringe 732 and may be substantially near the center 731, which is between the first fringe 730 and the second fringe 732. The second word line WL2 712 has a first fringe 740 and a second fringe 742 with a non-fringe area 741. In other embodiments of the invention, the non-fringe area 741 is an area that is away from the first fringe 740 and away from the second fringe 742 and maybe substantially near the center 741, which is between the first fringe 740 and the second fringe 742. The third word line WL3 714 has a first fringe 750 and a second fringe 752 with a non-fringe area 751. In other embodiments of the invention, the non-fringe area 751 is an area that is away from the first fringe 750 and away from the second fringe 752 and may be substantially near the center 751, which is between the first fringe 750 and the second fringe 752. The virtual ground array 700 has not had a fringe-induced effect because the hole charge injection has not been applied to the virtual ground array 700.

Figure 7B:
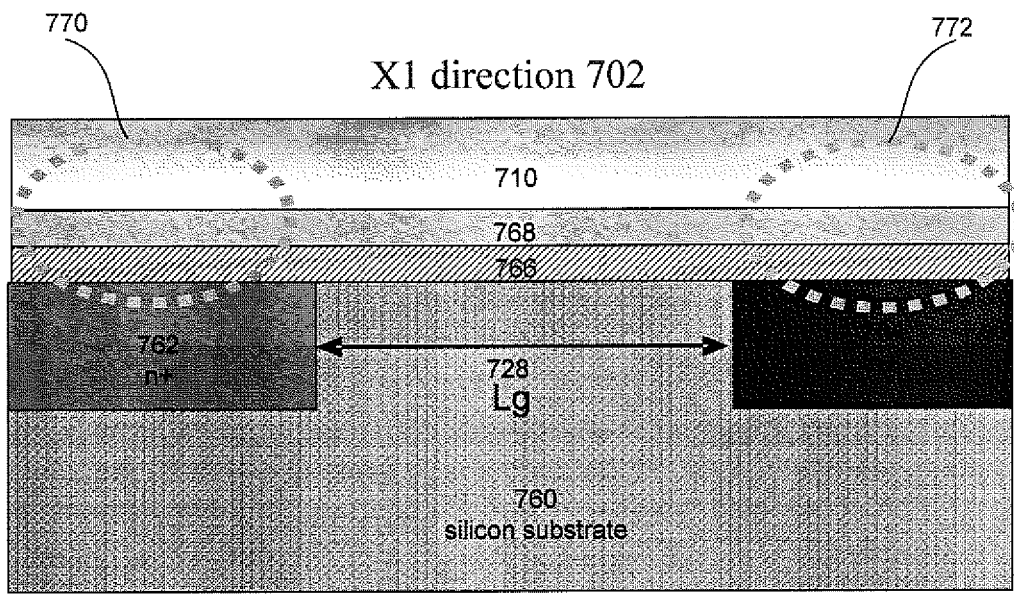
FIG. 7B illustrates a perspective view of the virtual ground array in the X1 direction with a charge trapping layer on source and drain junctions in accordance with the present invention.

FIG. 7B illustrates a perspective view of the virtual ground array 700 in the X1 direction 702 with a charge trapping layer on source and drain junctions. The virtual ground array 700 comprises a substrate with a source region (n+) 762 that is spaced apart from a drain region 764 (n+) by the channel length Lg 728. In this embodiment, a dielectric layer 766 overlies the substrate 760, and a charge trapping layer 768 overlies the dielectric layer 766, and the gate 710 overlies the charge trapping layer 768. In this embodiment, the charge trapping layer 768 extends above the source region 762, as indicated by a dotted circuit 770, and extends above the drain region 764, as indicated by a dotted circle 772.

Figure 7C:
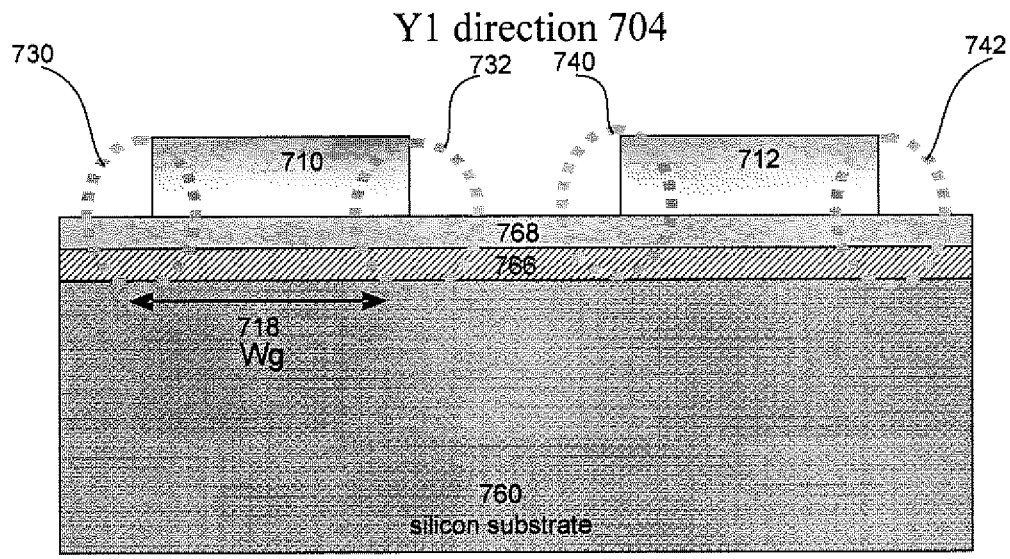
FIG. 7C illustrates a perspective view of the virtual ground array in the Y1 direction with the charge trapping layer on fringes of word lines in accordance with the present invention.

FIG. 7C illustrates a perspective view of the virtual ground array 700 in the Y1 direction 704 with the charge trapping layer 768 on fringes of word lines. As observed from the Y1 direction 704, the first word line WL1 710 and the second word line WL2 712 have bottom surfaces that are in contact with the charge trapping layer 768. The charge trapping layer 768 has a top surface that is in contact with the first and second fringes 730, 732 of the first word line 710, which is in contact with the first and second fringes 740, 742 of the second word line 712.

Figure 8A:
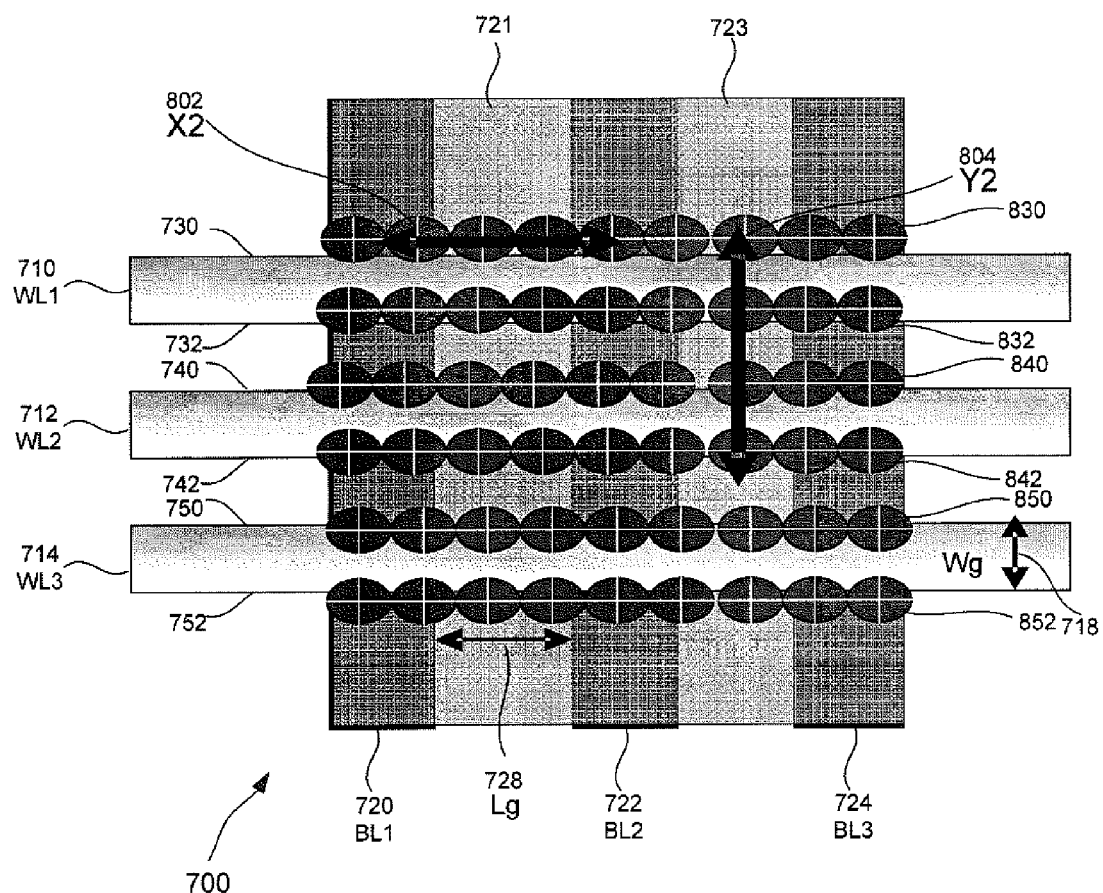
FIG. 8A is a structural diagram illustrating a top view in the second embodiment of the virtual ground array after a hole charge injection method has been conducted in accordance with the present invention.

FIG. 8A is a structural diagram illustrating a top view in the second embodiment of the virtual ground array 700 after a hole charge injection method has been performed. After the hole charge injection, hole charges are stored along fringes of each word line because the fringes have a large electrical field in comparison to near the center of each word line. A plurality of hole charges 830 are stored along the first fringe 730 in the first word line WL1 710 and intersect with the first charge trapping portion 721 and the second charge trapping portion 723. Hole charges are also stored along the other fringe of the word line. More specifically, a plurality of hole charges 832 is stored along the second fringe 732 in the first word line WL1 710 and intersects with the first charge trapping portion 721 and the second charge trapping portion 723. With respect to the second word line WL2 712, a plurality of hole charges 840 is stored along the first fringe 740 in the second word line WL2 712 and intersects with the first charge trapping portion 721 and the second charge trapping portion 723. A plurality of hole charges 842 is stored along the second fringe 742 in the second word line WL2 712 and intersects with the first charge trapping portion 721 and the second charge trapping portion 723. As for the third word line WL3 714, a plurality of hole charges 850 is stored along the first fringe 750 in the third word line WL3 714 and intersects with the first charge trapping portion 721 and the second charge trapping portion 723. A plurality of hole charges 852 is stored along the second fringe 752 in the third word line WL3 714 and intersects with the first charge trapping portion 721 and the second charge trapping portion 723.

Figure 8B:
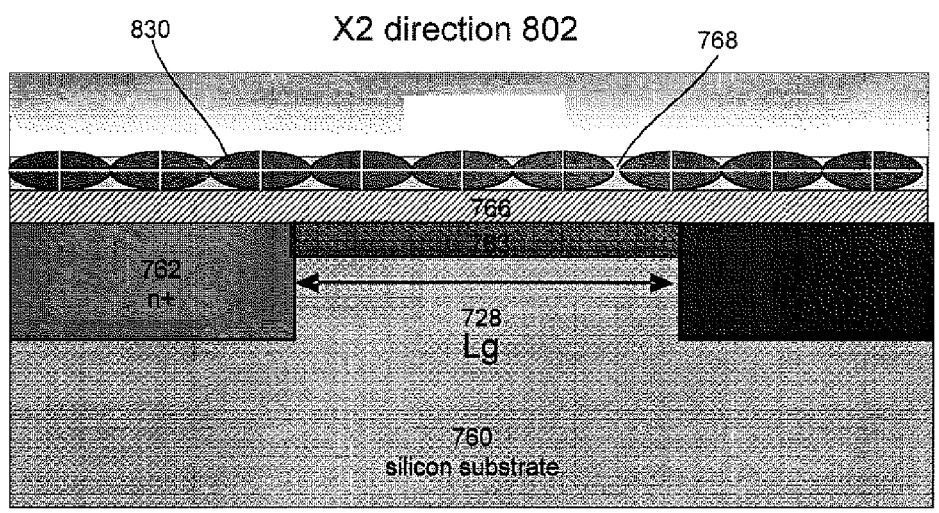
FIG. 8B illustrates a perspective view of the virtual ground array with the hole charges stored on the charge trapping layer in the X2 direction in accordance with the present invention.

FIG. 8B illustrates a perspective view of the virtual ground array 700 with the hole charges 830 stored on the charge trapping layer 768 in the X2 direction 802. The hole charges 830 cause a fringe or induced channel to have a lower voltage threshold level. The induced channel 763 means the virtual ground array 700 is turned on such that the source and drain regions 762, 764 are conducting. The voltage threshold Vt typically dominates the device operation of the virtual ground array 700.

Figure 8C:
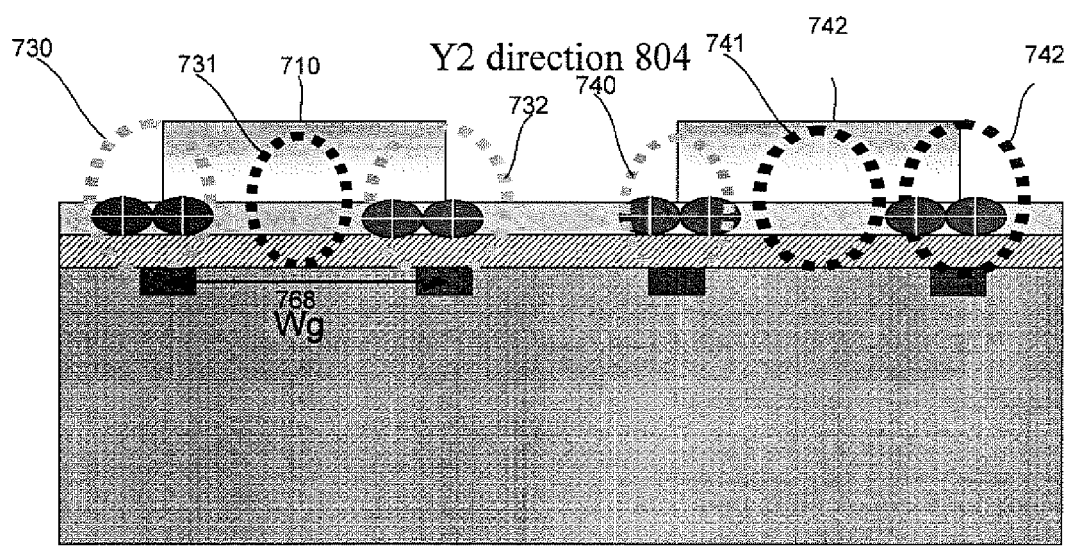
FIG. 8C illustrates a perspective view of the virtual ground array in the Y2 direction with a charge trapping layer on the fringes of word lines in accordance with the present invention.

FIG. 8C illustrates a perspective view of the virtual ground array 700 in the Y2 direction 804 with a charge trapping layer on the fringes of word lines. As shown in the Y2 direction 804, the first word line WL1 710 and the second word line WL2 712 have bottom surfaces that are in contact with the charge trapping layer 768. The charge trapping layer 768 has a top surface that is in contact with the first and second fringes 730, 732 of the first word line 710 and that is in contact with the first and second fringes 740, 742 of the second word line 712. The non-fringe area 731 in the charge trapping layer and underneath the first word line 710 does not store hole charges. Similarly, the non-fringe area 741 in the charge trapping layer and underneath the first word line 710 does not store hole charges.

Figure 9:
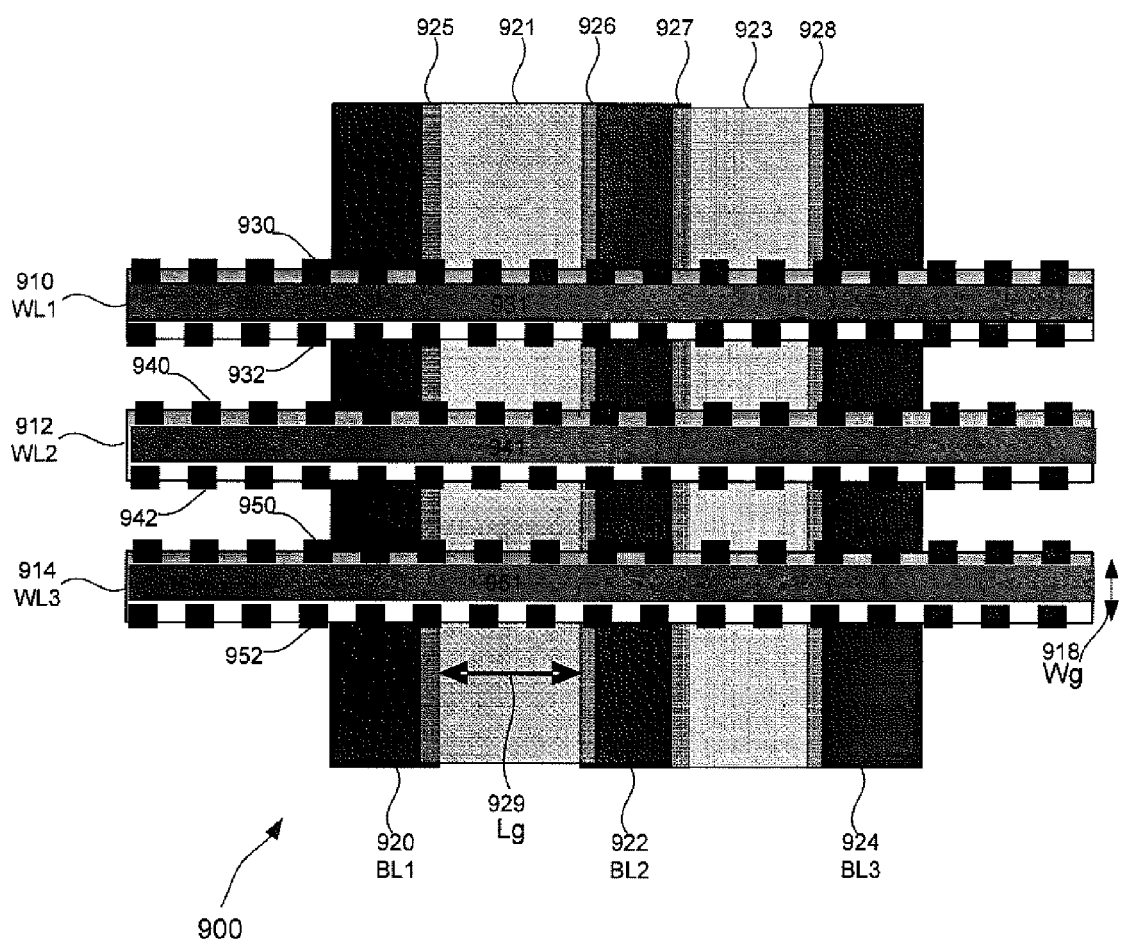
FIG. 9 is a structural diagram illustrating a top view in a third embodiment of a virtual ground array before a hole charge injection method has bee performed on an MNOS memory as asymmetric voltage threshold levels along word lines in accordance with the present invention.

FIG. 9 is a structural diagram illustrating a top view in a third embodiment of a virtual ground array 900 before a hole charge injection method implemented on an MNOS memory as asymmetric voltage threshold levels along word lines. The virtual ground array 900 comprises a plurality of word lines WL1 910, WL2 912 and WL3 914 extending in a horizontal direction. Each of the WL1 910, WL2 912 and WL3 914 has a width, represented by a symbol Wg 918. The virtual ground array 900 also includes a plurality of bit lines BL1 920, BL2 922 and BL3 924, with a first charge trapping portion 921 disposed between the bit lines BL1 920, BL2 922, and a second charge trapping portion 923 disposed between the bit lines BL2 922, BL3 924, where they extend in a vertical direction. Each of the charge trapping portions 921, 923 has a length, represented by a symbol Lg 929. The first charge trapping portion 921 and the second charge trapping portion 923 are part of a charge trapping layer. In the intersection of the first charge trapping portion 921 and the first, second, third word lines WL1 910, WL2 912, WL3 914, a first dielectric strip 925 and a second dielectric strip 926 extend vertically on each side of the first charge trapping portion 921. In the intersection of the second charge trapping portion 923 and the first, second, third word lines WL1 910, WL2 912, WL3 914, a third dielectric strip 927 and a fourth dielectric strip 928 extend vertically on each side of the second charge trapping portion 923.

The first word line WL1 910 has a first fringe 930 as depicted by dotted square lines, and a second fringe 932 as depicted with dotted square lines, with a non-fringe area 931 as depicted by a solid line. Embodiments of the invention refer to the non-fringe area 931 as an area that is away from the first fringe 930 and away from the second fringe 932 and may be substantially near the center 931, which is between the first fringe 930 and the second fringe 932. The second word line WL2 912 has a first fringe 940 as depicted with dotted square lines, a second fringe 942 as depicted with dotted square lines, and a non-fringe area 941 as depicted by a solid line. Embodiments of the invention refer to the non-fringe area 941 as an area that is away from the first fringe 940 and away from the second fringe 942 and may be substantially near the center 941, which is between the first fringe 940 and the second fringe 942. The third word line WL3 914 has a first fringe 950 as depicted with dotted square lines, a second fringe 952 as depicted with dotted square lines, and a non-fringe area 951 as depicted by a solid line. In other embodiments of the invention, the non-fringe area 951 is an area that is away from the first fringe 950 and away from the second fringe 952 and may be substantially near the center 951, which is between the first fringe 950 and the second fringe 952. The virtual ground array 900 has not had a fringe-induced effect because the hole charge injection has not been applied to the virtual ground array 900.

Each of the word lines WL1 910, WL2 912, WL3 914 is associated with two voltage threshold levels, a fringe voltage threshold level as represented by the symbol $Vt_{fringe}$, and a non-fringe voltage threshold level as represented by the symbol $Vt_{non-infringe}$. In some embodiments, the fringes 930, 932 are associated with the fringe voltage threshold level $Vt_{fringe}$ and the non-fringe area 931 is associated with the non-fringe voltage threshold $Vt_{non-infringe}$. Typically a lower voltage threshold level dominates a device operation behavior. In order to operate the virtual ground array 900 at fringes of a word line, the fringe voltage threshold $Vt_{fringe}$ is less than the non-fringe voltage threshold $Vt_{non-infringe}$.

Figure 10:
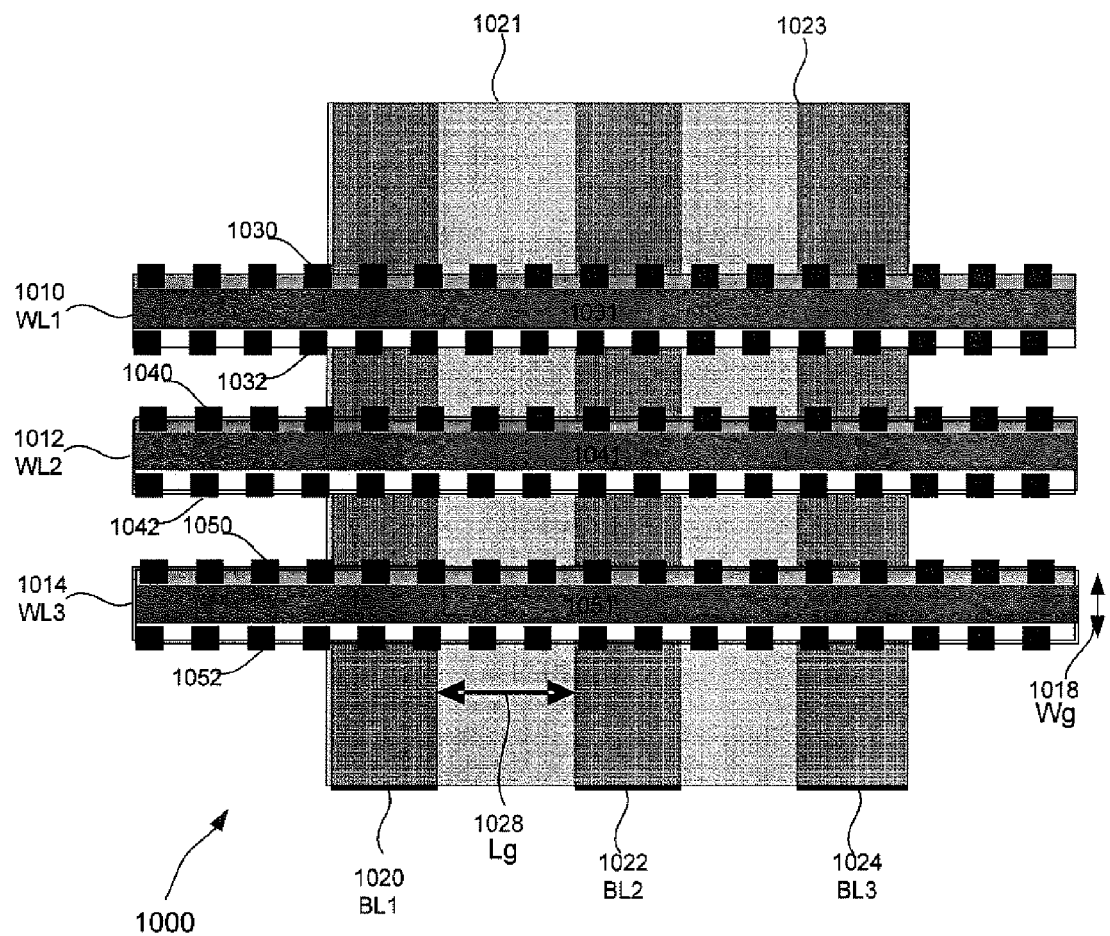
FIG. 10 is a structural diagram illustrating a top view in a fourth embodiment of a virtual ground array before a hole charge injection method has been performed on an MNOS memory as asymmetric voltage threshold levels along word lines in accordance with the present invention.
Figure 11:
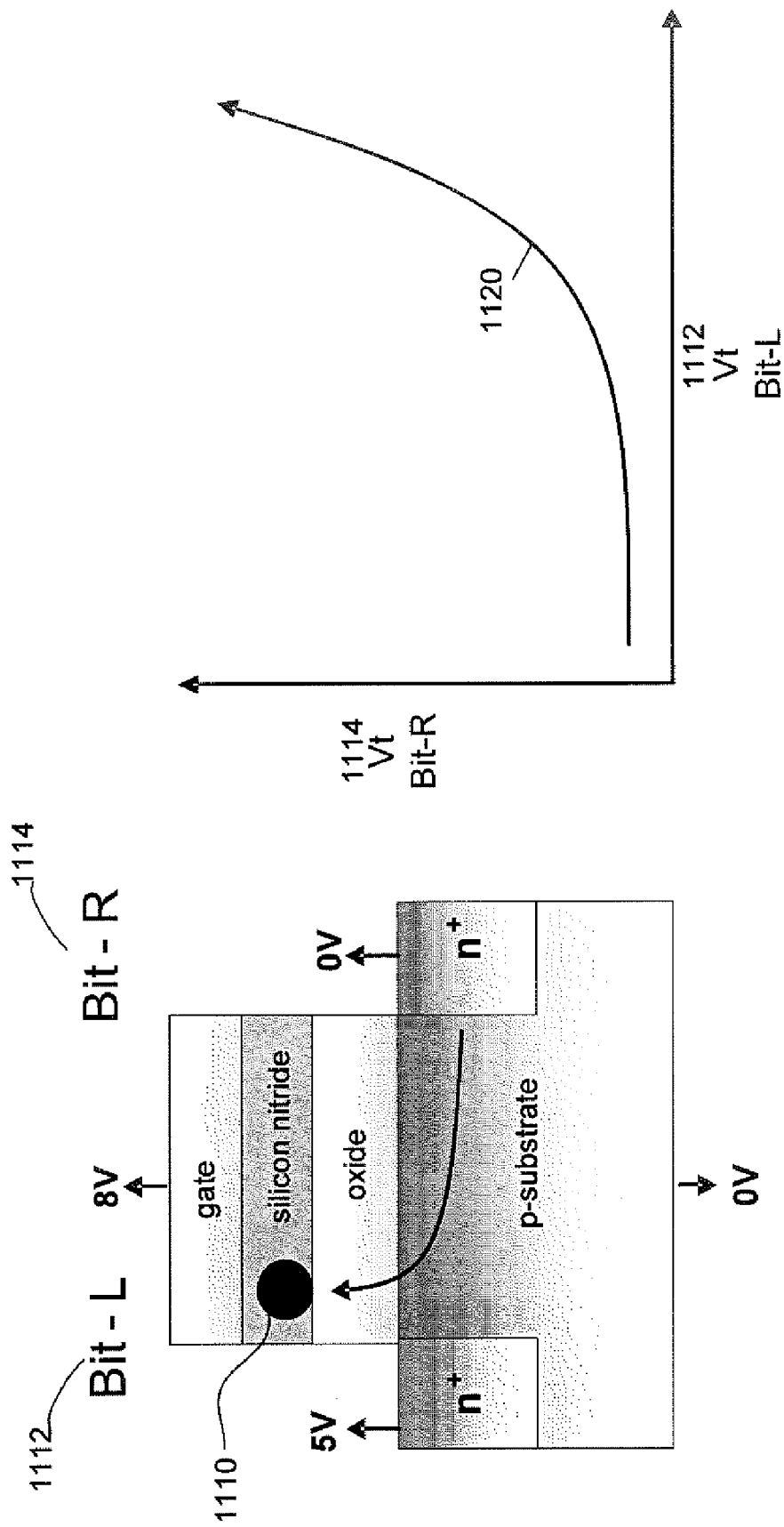
FIG. 11A is a structural diagram illustrating the programming of the left bit in an MNOS structure.
FIG. 11B is a corresponding graphical diagram of a two-bit-per-cell operation window that illustrates the second bit effect, which in this instance refers to the right bit.

FIG. 10 is a structural diagram illustrating a top view in a fourth embodiment of a virtual ground array 1000 before a hole charge injection method is implemented on an MNOS memory as asymmetric voltage threshold levels along word lines. The virtual ground array 1000 comprises a plurality of word lines WL1 1010, WL2 1012 and WL3 1014 extending in a horizontal direction. Each of the word lines WL1 1010, WL2 1012 and WL3 1014 has a width, represented by a symbol Wg 1018. The virtual ground array 1000 also includes a plurality of bit lines BL1 1020, BL2 1022 and BL3 1024, with a first charge trapping portion 1021 disposed between the bit lines BL1 1020, BL2 1022, and a second charge trapping portion 1023 disposed between the bit lines BL2 1022, BL3 1024, where they extend in a vertical direction. Each of the charge trapping portions 1021, 1023 has a length, represented by a symbol Lg 1028. The first charge trapping portion 1021 and the second charge trapping portion 1023 are part of a charge trapping layer.

The first word line WL1 1010 has a first fringe 1030 depicted by dotted square lines, and a second fringe 1032 depicted with dotted square lines, with a non-fringe area 1031 depicted by a solid line. Embodiments of the invention refer to the non-fringe area 1031 as an area that is away from the first fringe 1030 and away from the second fringe 1032 and may be substantially near the center 1031, which is between the first fringe 1030 and the second fringe 1032. The second word line WL2 1012 has a first fringe 1040 depicted with dotted square lines, a second fringe 1042 depicted with dotted square lines, and a non-fringe area 1041 depicted by a solid line. Embodiments of the invention refer to the non-fringe area 1041 as an area that is away from the first fringe 1040 and away from the second fringe 1042 and may be substantially near the center 1041, which is between the first fringe 1040 and the second fringe 1042. The third word line WL3 1014 has a first fringe 1050 depicted with dotted square lines, a second fringe 1052 depicted with dotted square lines, and a non-fringe area 1051 depicted by a solid line. Embodiments of the invention refer to the non-fringe area 1051 as an area that is away from the first fringe 1050 and away from the second fringe 1052 and may be substantially near the center 1051, which is between the first fringe 1050 and the second fringe 1052. The virtual ground array 1000 has not had a fringe-induced effect because the hole charge injection has not been applied to the virtual ground array 1000.

Each of the word lines WL1 110, WL2 1012, WL3 1014 is associated with two voltage threshold levels, a fringe voltage threshold level represented by a symbol $Vt_{fringe}$, and a non-fringe voltage threshold level represented by a symbol $Vt_{non-infringe}$. In some embodiments, the fringes 1030, 1032 associated with the fringe voltage threshold level $Vt_{fringe}$ and the non-fringe 1031 area are associated with the non-infringe voltage threshold $Vt_{non-infringe}$. Typically a lower voltage threshold level dominates a device operation behavior. In order to operate the virtual ground array 1000 at fringes of a word line, the fringe voltage threshold $Vt_{fringe}$ is less than the non-fringe voltage threshold $Vt_{non-infringe}$.

FIG. 11A is a structural diagram illustrating the programming of the left bit (Bit-L) in a MN(O)S structure, and FIG. 11B is a corresponding graphical diagram of a two-bit-per-cell operation window that illustrates the second bit effect, which in this instance refers to the right bit (Bit-R). A second bit effect occurs in a charge trapping memory that employs a two-bit-per-cell operation, i.e. a left bit and right bit. When one of the two bits is programmed, the voltage threshold for the other bit may also increase even though only one bit is being programmed. The programming of a left bit is illustrated in FIG. 11A with an indication of charges 1110 on a left side 1112. Although only the left bit 1112 is programmed, the programming of the left bit 1112 also causes the voltage threshold of a right bit 1114 to increase, as shown in FIG. 11B. A curve 1120 illustrates that the voltage threshold of the right bit 1114 drifts higher as the left bit 1112 is being programmed. Such a phenomenon is referred to as a second bit effect. An ideal curve, without the second bit effect, would show that continuous programming of a left bit would cause the voltage threshold of the left bit to increase but the voltage threshold of the right bit would not be affected such that the voltage threshold of the right bit would remain substantially constant.

Figure 12:
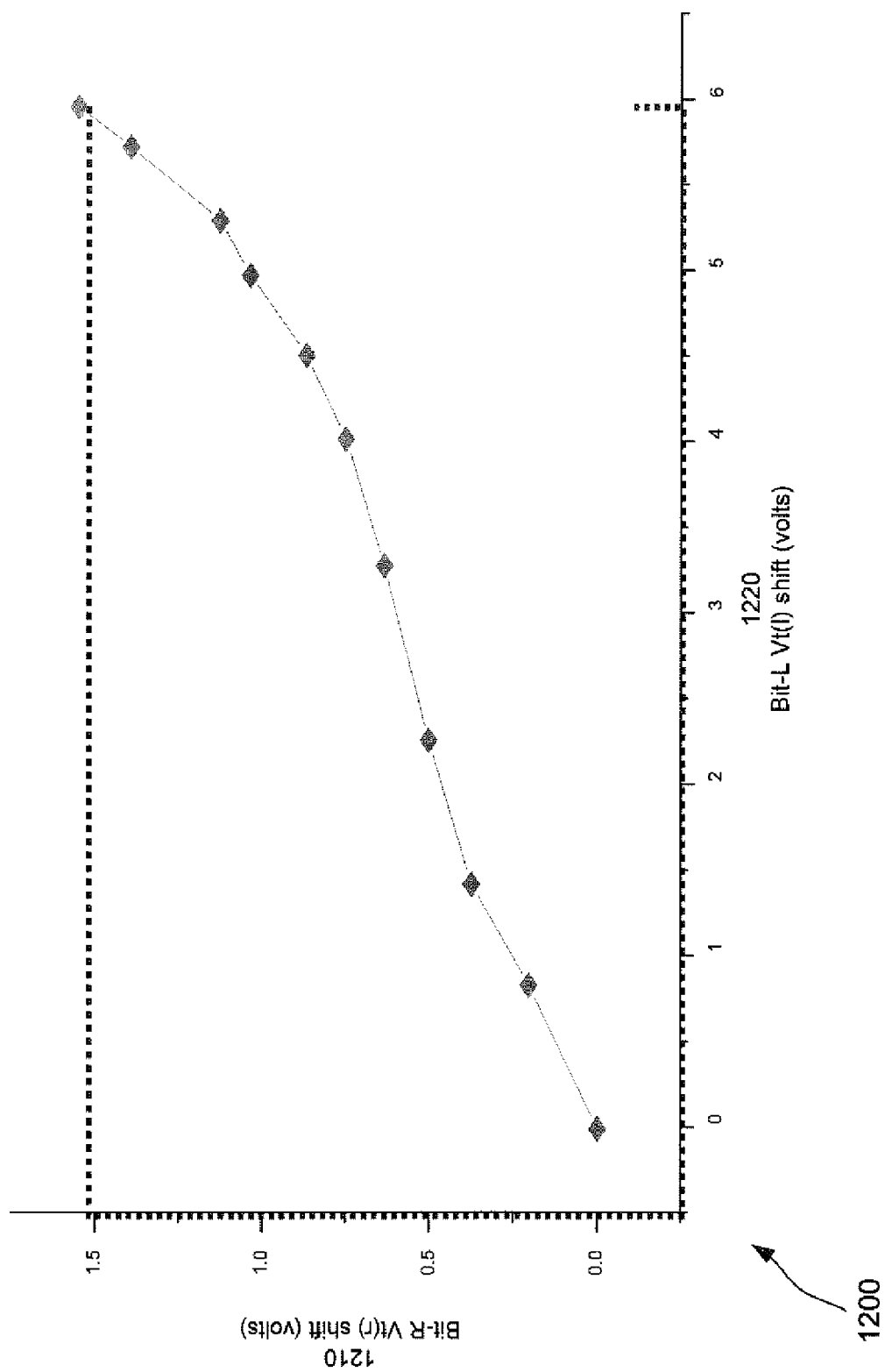
FIG. 12 illustrate a graphical diagram of a sample curve of a second bit window of a virtual ground array with a hole injected fringe induced operation.

FIG. 12 illustrates a graphical diagram 1200 of a sample curve of a second bit window of a virtual ground array with a hole injected fringe induced operation. A second bit window is defined as the difference between the shift in the voltage threshold of the right bit Vt(r) 1210 and the shift in the voltage threshold of the left bit Vt(l) 1220. As depicted in FIG. 12, the voltage threshold of the left bit has shifted to about 60 volts, and the voltage threshold of the right bit has shifted to about 1.4 volts. Therefore, the second bit window in this instance is calculated as the difference between the shift in Vt(l) 1220 and shift in Vt(r) 1210, which is computed as follows: 6.0 volts−1.5 volts=4.5 volts. The graph 1200 is intended as just one illustration and should not be interpreted to be limiting, and the operation window of 4.5 volts is a desirable parameter.

For additional information on the hole injection methods and second bit effect of a charge trapping memory that stores multiple bits per cell, see U.S. patent application Ser. No. 11/425,482 entitled "Methods and Structures for Expanding a Memory Operation Window and Reducing a Second Bit Effect", filed concurrently with the present application, owned by the assignee of this application and incorporated by reference as if fully set forth herein.

An ordinary artisan should require no additional explanation in developing the methods and systems described herein but may nevertheless find some possibly helpful guidance in the preparation of these methods and systems by examining standard reference works in the relevant art.

The invention has been described with reference to specific exemplary embodiments. Although terms like fringe and non-fringe are described, other similar or equivalent terms may be practiced within the spirits of the present invention, such as edge and non-edge. Various modifications, adaptations, and changes may be made without departing from the spirit and scope of the invention. Accordingly, the specification and drawings are to be regarded as illustrative of the principles of this invention rather than limiting, the invention is defined by the following appended claims.

I claim:

1. A memory device, comprising:
   a substrate;
   a charge trapping structure overlying the substrate, the charge trapping structure extending in a first direction; and
   a gate electrode extending in a second direction and intersecting with the charge trapping layer, the gate electrode having a bottom surface defined by a first fringe that is spaced apart from a second fringe and a non-fringe section between the first fringe and the second fringe, the non-fringe having a first voltage threshold, the first and second fringes having a second voltage threshold, the second voltage threshold being a lower value than the first voltage threshold;
   a biasing arrangement on the gate electrode and the substrate, by which holes are moved to the charge trapping layer by hole injection, and positioned underneath and along the first and second fringes of the gate electrode.

2. The device of claim 1, wherein holes are stored in the charge trapping layer, and positioned underneath and along both sides of the first and second fringes each word line.

3. The device of claim 1, wherein the biasing arrangement includes a positive gate voltage on the gate electrode which causes erasure of the memory device to a negative threshold voltage level by moving holes from the gate electrode to the charge trapping structure.

4. The device of claim 1, wherein the biasing arrangement includes a negative gate voltage on the gate electrode which causes erasure of the memory device to a negative threshold voltage level by moving holes from the substrate to the charge trapping structure.

5. The device of claim 1, wherein the charge trapping structure comprises a charge trapping layer overlying a dielectric layer.

6. The device of claim 1, wherein the charge trapping structure comprises a top dielectric layer overlying a charge trapping layer, and the charge trapping layer overlying a bottom dielectric layer.

7. The device of claim 1, further comprising a first dielectric section and a second dielectric section, the charge trapping layer disposed between the first and second dielectric sections.

8. A memory structure, comprising:
   one or more bit lines extending in parallel with one another;
   a word line extending in a second direction and intersecting with the charge trapping layer, the word line having a bottom surface defined by a first fringe that is spaced apart from a second fringe, and a non-fringe section between the first fringe and the second fringe, the non-fringe section having a first voltage threshold, the first and second fringes having a second voltage threshold, the second voltage threshold being a lower value than the first voltage threshold; and
   a charge trapping layer disposed underneath the one or more word lines and in contact with the bottom surface of each word line;
   a biasing arrangement on the gate electrode and the substrate, by which holes are moved to the charge trapping layer by hole injection, and positioned underneath and along the first and second fringes of each word line.

9. A memory device, comprising:
   a substrate;
   a charge trapping structure overlying the substrate, the charge trapping structure having a length along a direction of current flow in the substrate, and having a width transverse to the direction of current flow in the substrate;
   a gate electrode overlying the charge trapping layer, the gate electrode having first and second sides defining a width of the gate electrode less than the width of the charge trapping structure, so that the charge trapping structure includes a first fringe section adjacent the first side of the gate electrode, a second fringe section adjacent the second side of the gate electrode, and a non-fringe section between the first fringe section and the second fringe section; and
   a biasing arrangement on the gate electrode and the substrate, by which holes are moved to the first and second fringe sections of the charge trapping layer by hole injection.

10. The device of claim 9, wherein the biasing arrangement includes a positive gate voltage on the gate electrode which causes erasure of the memory device to a negative threshold voltage level by moving holes from the gate electrode to the charge trapping structure.

11. The device of claim 9, wherein the biasing arrangement includes a negative gate voltage on the gate electrode which causes erasure of the memory device to a negative threshold voltage level by moving holes from the substrate to the charge trapping structure.

12. The device of claim 9, wherein the charge trapping structure comprises a charge trapping layer overlying a dielectric layer.

13. The device of claim 9, wherein the charge trapping structure comprises a top dielectric layer overlying a charge trapping layer, and the charge trapping layer overlying a bottom dielectric layer.

14. The device of claim 9, further comprising a first dielectric section and a second dielectric section, the charge trapping layer disposed between the first and second dielectric sections.

15. The device of claim 9, wherein:
   the substrate includes first and second doped regions separated along the direction of current flow by a channel region; and
   the charge trapping structure overlies the channel region and has first and second charge storage regions adjacent the first and second doped regions respectively.

16. The device of claim 15, wherein said biasing arrangement sets both of the first and second charge storage regions to a negative threshold voltage, and further comprising a second biasing arrangement on the substrate, gate electrode, and the first and second doped regions to program the first charge storage region to a positive voltage, wherein after said second biasing arrangement a difference in threshold voltages between the first and second charge storage regions is greater than or equal to 4 Volts.

17. A memory structure, comprising:
   a plurality of bit lines within a substrate and extending in a first direction;

a plurality of word lines overlying the plurality of bit lines in the substrate and extending in a second direction, respective word lines having sides;

a charge trapping layer between the plurality of bit lines and the plurality of word lines, the charge trapping layer extending in the first direction beyond the sides of the word lines, so that the charge trapping layer includes first and second fringe sections adjacent the sides of the word lines, and non-fringe sections between the first and second fringe sections; and a biasing arrangement on a particular word line in the plurality of word lines and the substrate, by which holes are moved to the first and second fringe sections of the charge trapping layer adjacent the sides of the particular word line by hole injection.

18. The memory structure of claim 17, wherein the charge trapping layer extends between adjacent word lines in the plurality of word lines.

19. The memory structure of claim 17, wherein:

the plurality of bit lines includes first and second bit lines underlying said particular word line;

the charge trapping structure includes first and second charge storage regions adjacent the first and second bit lines respectively; and wherein said biasing arrangement sets both of the first and second charge storage regions to a negative threshold.

20. The memory structure of claim 19, further comprising a second biasing arrangement on the substrate, said particular word line, and the first and second bit lines to program the first charge storage region to a positive voltage, wherein after said second biasing arrangement a difference in threshold voltages between the first and second charge storage regions is greater than or equal to 4 Volts.

* * * * *